(12) United States Patent
Harada et al.

(10) Patent No.: US 12,520,512 B2
(45) Date of Patent: Jan. 6, 2026

(54) MANUFACTURING METHOD OF PILLAR-SHAPED SEMICONDUCTOR DEVICE

(71) Applicant: Unisantis Electronics Singapore Pte. Ltd., Singapore (SG)

(72) Inventors: Nozomu Harada, Tokyo (JP); Kenichi Kanazawa, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 440 days.

(21) Appl. No.: 18/319,716

(22) Filed: May 18, 2023

(65) Prior Publication Data
US 2023/0327001 A1    Oct. 12, 2023

Related U.S. Application Data

(63) Continuation of application No. PCT/JP2020/043750, filed on Nov. 25, 2020.

(51) Int. Cl.
*H10D 30/01*  (2025.01)
*H10B 10/00*  (2023.01)
*H10D 30/67*  (2025.01)

(52) U.S. Cl.
CPC ........... *H10D 30/025* (2025.01); *H10B 10/12* (2023.02); *H10D 30/6735* (2025.01)

(58) Field of Classification Search
CPC .. H10D 30/025; H10D 30/63; H10D 30/6728; H10D 30/6735; H10D 64/252
See application file for complete search history.

(56) References Cited

U.S. PATENT DOCUMENTS

| 8,530,960 B2 | 9/2013 | Masuoka et al. |
| 2010/0219483 A1 | 9/2010 | Masuoka et al. |
| 2019/0088792 A1 | 3/2019 | Goto |

(Continued)

FOREIGN PATENT DOCUMENTS

| JP | H02-188966 A | 7/1990 |
| JP | 2019-054151 A | 4/2019 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka, "Impact of Surrounding Gate Transistor (SGT) for Ultra-High-Density LSI's", IEEE Transaction on Electron Devices, vol. 38, No. 3, pp. 573-578 (1991).

(Continued)

*Primary Examiner* — Nelson Garces
(74) *Attorney, Agent, or Firm* — Crowell & Moring LLP

(57) ABSTRACT

$P^+$ layers which entirely cover top parts of Si pillars and which surround the Si pillars at equal widths in a plan view are formed by self-alignment with the Si pillars, W layers are formed on the $P^+$ layers, a band-shaped contact hole which is in contact with respective partial regions of the W layers and which extends in the Y direction is formed, and a supply wiring metal layer is formed by filling the band-shaped contact hole. The partial regions of the W layers are shaped so as to protrude to outside of the band-shaped contact hole in a plan view.

9 Claims, 33 Drawing Sheets

(56) References Cited

U.S. PATENT DOCUMENTS

2019/0148387 A1* 5/2019 Masuoka ........... H10D 84/0186
　　　　　　　　　　　　　　　　　　　　　　　257/329
2021/0242028 A1 　8/2021 Masuoka et al.
2021/0358754 A1 11/2021 Masuoka et al.

FOREIGN PATENT DOCUMENTS

| WO | WO 2019/087328 A1 | 5/2019 | | |
|---|---|---|---|---|
| WO | WO 2020/070767 A1 | 4/2020 | | |
| WO | WO-2020129237 A1 | * | 6/2020 | ........... H10D 30/025 |
| WO | WO-2020202554 A1 | * | 10/2020 | ......... H10D 30/6735 |

OTHER PUBLICATIONS

C.Y. Ting, V.J. Vivalda, and H.G.Schaefer: "Study of planarized sputter-deposited SiO2", J. Vac. Sci. Technol., vol. 15, No. 3, pp. 1105-1112, May/Jun. 1978.

A. Raley, S. Thibaut, N. Mohanty, K. Subhadeep, S. Nakamura, et al., "Self-aligned quadruple patterning integration using spacer on spacer pitch splitting at the resist level for sub-32nm pitch applications" Proc. of SPIE vol. 9782, 2016.

* cited by examiner

MANUFACTURING METHOD OF PILLAR-SHAPED SEMICONDUCTOR DEVICE

The present application is a Continuation application of PCT/JP2020/043750, filed Nov. 25, 2020, the entire contents of which are incorporated herein by reference.

BACKGROUND OF THE INVENTION

Field of the Invention

The present invention relates to a manufacturing method of a pillar-shaped semiconductor device.

Description of the Related Art

In recent years, three-dimensional transistors are used in LSI (Large Scale Integration). Among such three-dimensional transistors, an SGT (Surrounding Gate Transistor) which is a pillar-shaped semiconductor device is garnering attention as a semiconductor element that provides a highly-integrated semiconductor device. In addition, there is a need for higher integration and higher performance of semiconductor devices having an SGT.

With an ordinary planar MOS transistor, a channel extends in a horizontal direction along an upper surface of a semiconductor substrate. In contrast, a channel of an SGT extends in a vertical direction relative to the upper surface of the semiconductor substrate (for example, refer to Japanese Patent Laid-Open No. H2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Therefore, an SGT enables further densification of a semiconductor device as compared to a planar MOS transistor.

FIGS. 5A and 5B show schematic structural diagrams of an N channel SGT. FIG. 5A represents a sectional view and FIG. 5B represents a plan view. N$^+$ layers 121a and 121b being semiconductor layers containing a high concentration of donor impurities of which one becomes a drain when the other becomes a source are formed at upper and lower positions inside a silicon semiconductor pillar 120 (hereinafter, a silicon semiconductor pillar will be referred to as a "Si pillar") having a P or i (intrinsic) conductivity type. A portion of the Si pillar 120 between the N$^+$ layers 121a and 121b to become a source and a drain becomes a channel region 122. A gate insulating layer 123 is formed so as to surround the channel region 122. A gate conductor layer 124 is formed so as to surround the gate insulating layer 123. The SGT is constituted of the N$^+$ layers 121a and 121b to become a source and a drain, the channel region 122, the gate insulating layer 123, and the gate conductor layer 124. The N$^+$ layer 121b and a source wiring metal layer S are connected via a contact hole C opened in an insulation layer 125 on the N$^+$ layer 121b. Accordingly, an occupied area of the SGT in a plan view corresponds to an occupied area of a single source or drain N$^+$ layer of a planar MOS transistor. Therefore, a circuit chip having an SGT enables a further reduction in chip size as compared to a circuit chip having a planar MOS transistor.

In addition, there is a problem that has to be overcome when attempting to further reduce the chip size. As shown in FIG. 5, the contact hole C which connects the source wiring metal layer S and the N$^+$ layer 121b is formed on the Si pillar 120 in a plan view. When the reduction of the chip size advances, a distance between the Si pillar 120 and an adjacent Si pillar decreases. Accordingly, a distance to a contact hole adjacent to the contact hole C in a plan view decreases. Therefore, there is a need for miniaturization and densification of a contact hole formation step.

FIG. 6 shows a circuit diagram of an SRAM (Static Random Access Memory) cell using an SGT. The present SRAM cell circuit includes two inverter circuits. One of the inverter circuits is constituted of a P channel SGT Pc1 as a load transistor and an N channel SGT Nc1 as a drive transistor. The other inverter circuit is constituted of a P channel SGT Pc2 as a load transistor and an N channel SGT Nc2 as a drive transistor. A gate of the P channel SGT Pc1 and a gate of the N channel SGT Nc1 are connected to each other. A drain of the P channel SGT Pc2 and a drain of the N channel SGT Nc2 are connected to each other. A gate of the P channel SGT Pc2 and a gate of the N channel SGT Nc2 are connected to each other. A drain of the P channel SGT Pc1 and a drain of the N channel SGT Nc1 are connected to each other.

As shown in FIG. 6, sources of the P channel SGTs Pc1 and Pc2 are connected to a supply terminal Vdd. Sources of the N channel SGTs Nc1 and Nc2 are connected to a ground terminal Vss. Select N channel SGTs SN1 and SN2 are arranged on both sides of the two inverter circuits. Gates of the select N channel SGTs SN1 and SN2 are connected to a word line terminal WLt. A source and a drain of the select N channel SGT SN1 are connected to drains of the N channel SGT Nc1 and the P channel SGT Pc1 and to a bit line terminal BLt. A source and a drain of the select N channel SGT SN2 are connected to drains of the N channel SGT Nc2 and the P channel SGT Pc2 and to an inverted bit line terminal BLRt. In this manner, a circuit having an SRAM cell is constituted of a total of six SGTs including two load P channel SGTs Pc1 and Pc2, two drive N channel SGTs Nc1 and Nc2, and two select N channel SGTs SN1 and SN2 (for example, refer to U.S. Patent Application Publication No. 2010/0219483). In the SRAM cell, the Si pillars of the two load P channel SGTs Pc1 and Pc2 are formed in closest proximity to each other. In this case, formation of a contact hole on upper P$^+$ layers of the load P channel SGTs Pc1 and Pc2 becomes an issue in realizing higher integration of the SRAM cell.

There is a need for higher performance and higher integration in circuits using an SGT.

SUMMARY OF THE INVENTION

A manufacturing method of a pillar-shaped semiconductor device according to the present invention includes the steps of:

forming a first impurity layer on a substrate;

forming a first semiconductor layer on the first impurity layer;

forming a second impurity layer on the first semiconductor layer;

forming a first material layer on the second impurity layer;

forming a first semiconductor pillar by using the first material layer as a mask to etch the second impurity layer, the first semiconductor layer, and an upper layer of the first impurity layer in this order from top to bottom;

forming a gate insulating layer which surrounds the first semiconductor layer of the first semiconductor pillar and a gate conductor layer which surrounds the gate insulating layer;

forming a first interlayer insulating layer above an upper surface of the gate conductor layer in an outer circumferential part of a top part of the first semiconductor pillar;

forming a second material layer on the first interlayer insulating layer so as to surround side surfaces of the top part of the first semiconductor pillar and the first material layer;

forming a second interlayer insulating layer in an outer circumferential part in contact with a side surface of the second material layer;

forming a first depression which surrounds the top part of the first semiconductor pillar by using the second interlayer insulating layer as a mask to remove the first material layer and the second material layer; forming a third impurity layer so as to surround the second impurity layer in the top part of the first semiconductor pillar and inside the first depression;

forming a first conductor layer made of a metal or an alloy on the third impurity layer;

forming a third interlayer insulating layer on the first conductor layer;

forming a first band-shaped contact hole which extends in a band shape on the third interlayer insulating layer on the first conductor layer; and forming a first wire conductor layer which connects to the first conductor layer via the first band-shaped contact hole, wherein the first conductor layer protrudes more toward a side of the first wire conductor layer than the first contact hole in a plan view.

The invention described above can further include the steps of:

forming a fourth impurity layer adjacent to the first impurity layer on the substrate;

forming the first semiconductor layer on the first impurity layer and the fourth impurity layer;

forming the second impurity layer and a fifth impurity layer on the first semiconductor layer;

forming a third material layer on the fifth impurity layer;

forming the first semiconductor pillar by using the first material layer as a mask to etch the first impurity layer, the first semiconductor layer, and the second impurity layer in this order from top to bottom and, at the same time, forming a second semiconductor pillar by using the third material layer as a mask to etch the fifth impurity layer, the first semiconductor layer, and the fourth impurity layer in this order from top to bottom;

forming the gate insulating layer which surrounds the first semiconductor layer of the first semiconductor pillar and the second semiconductor pillar and a gate conductor layer which surrounds the gate insulating layer;

forming the first interlayer insulating layer above the upper surface of the gate conductor layer in the outer circumferential part of the top part of the first semiconductor pillar;

forming the second material layer on the first interlayer insulating layer so as to surround side surfaces of the top part of the first semiconductor pillar and the first material layer and, at the same time, forming a fourth material layer on the first interlayer insulating layer so as to surround side surfaces of a top part of the second semiconductor pillar and the third material layer;

forming the second interlayer insulating layer in an outer circumferential part in contact with side surfaces of the second material layer and the fourth material layer;

forming the first depression which surrounds the top part of the first semiconductor pillar and a second depression which surrounds the top part of the second semiconductor pillar by using the second interlayer insulating layer as a mask to remove the first material layer, the second material layer, the third material layer, and the fourth material layer;

forming the third impurity layer inside the second depression and, at the same time, forming a sixth impurity layer so as to surround the fifth impurity layer in the top part of the second semiconductor pillar;

forming a second conductor layer made of a metal or an alloy on the sixth impurity layer;

forming the first band-shaped contact hole on the third interlayer insulating layer on the second conductor layer; and forming the first wire conductor layer which connects the first conductor layer and the second conductor layer via the first band-shaped contact hole, wherein the semiconductor pillar which differs from the first semiconductor pillar and the second semiconductor pillar is not formed in a formation region of the first wire conductor layer in a plan view.

The invention described above can further include the steps of:

forming a third interlayer insulating layer on the first conductor layer, the second conductor layer, and the second interlayer insulating layer;

forming the first band-shaped contact hole which overlaps with a partial region of the first conductor layer and a partial region of the second conductor layer in a plan view on the third interlayer insulating layer; and forming the third wire conductor layer by filling the first band-shaped contact hole, wherein partial regions of the first conductor layer and the second conductor layer protrude more outward than the first band-shaped contact hole in a plan view.

The invention described above can further include the steps of:

forming a first mask material layer which overlaps with partial regions of the first material layer and the third material layer and partial regions of the second material layer and the fourth material layer and which connects the partial regions and forms a cavity in a plan view after forming the second interlayer insulating layer;

forming a third depression by using the first mask material layer as a mask to etch the first material layer, the third material layer, the second material layer, the fourth material layer, and the second interlayer insulating layer;

forming the third impurity layer and the sixth impurity layer so as to be connected to each other in the third depression; and forming a third conductor layer on the third impurity layer and the sixth impurity layer being connected to each other and in the third depression.

In the invention described above, the third conductor layer may be used as the first wire conductor layer.

In the invention described above, the third impurity layer may be formed by epitaxial crystal growth.

The invention described above can further include the steps of:

forming the third impurity layer inside the first depression;

forming the first conductor layer made of a metal or an alloy on the third impurity layer so that an upper surface of the first conductor layer becomes higher than an upper surface of the second interlayer insulating layer; and planarizing the first conductor layer so that an upper surface position of the first conductor layer equals an upper surface position of the second interlayer insulating layer.

The invention described above can further include the steps of:

forming a single crystal semiconductor thin film layer on a bottom part surface of the third depression; and consecutively forming a seventh impurity layer.

In the invention described above, a load SGT (Surrounding Gate Transistor) for an SRAM (Static Random Access Memory) cell circuit can be formed on the first semiconductor pillar and the second semiconductor pillar.

BRIEF DESCRIPTION OF THE DRAWINGS

FIGS. 1OA, 1OB and 1OC are a plan view and a sectional structural diagram for explaining the manufacturing method of a pillar-shaped semiconductor device having an SGT according to the first embodiment;

DETAILED DESCRIPTION OF THE PREFERRED EMBODIMENTS

Hereinafter, a manufacturing method of a pillar-shaped semiconductor device according to embodiments of the present invention will be described with reference to the drawings.

First Embodiment

Hereinafter, a manufacturing method of an SRAM cell circuit having an SGT according to a first embodiment of the present invention will be described with reference to FIGS. 1AA to 1TC. In each diagram, A represents a plan view, B represents a sectional structural diagram taken along an X-X' line in A, and C represents a sectional structural diagram taken along a Y-Y' line in A.

Figure 1A:
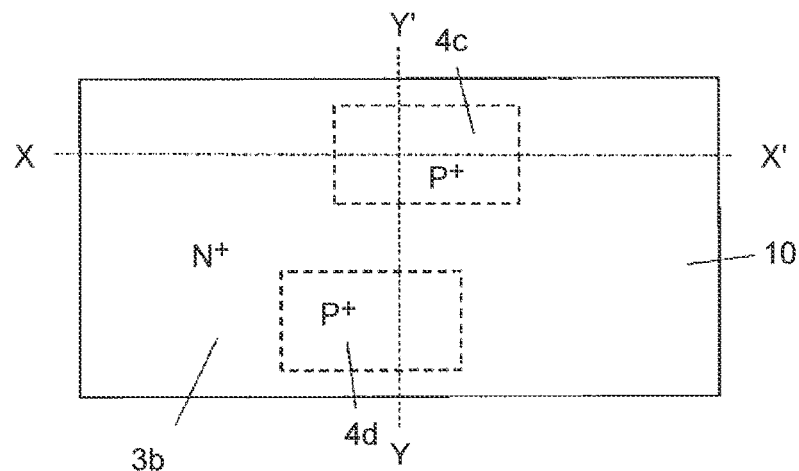
FIGS. 1AA, 1AB, and 1AC are a plan view and a sectional structural diagram for explaining a manufacturing method of a pillar-shaped semiconductor device having an SGT according to a first embodiment.
Figure 1A:
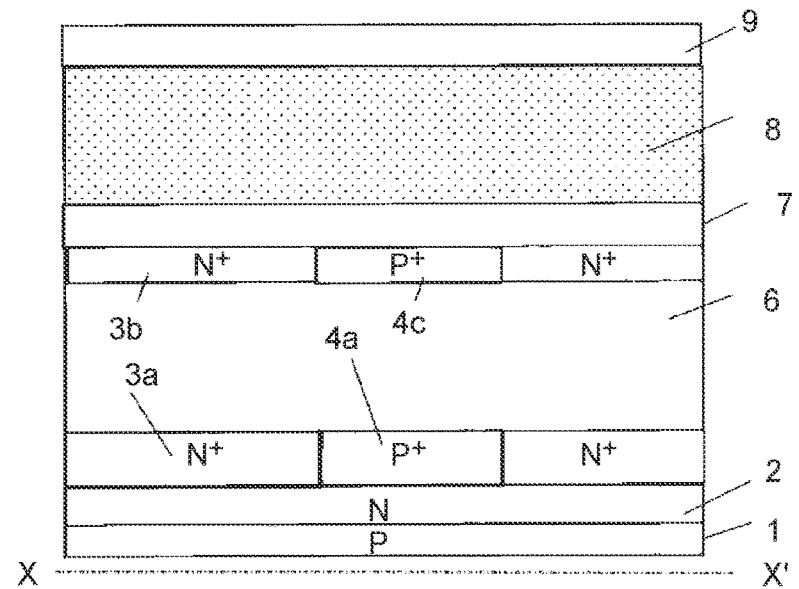
Figure 1A:
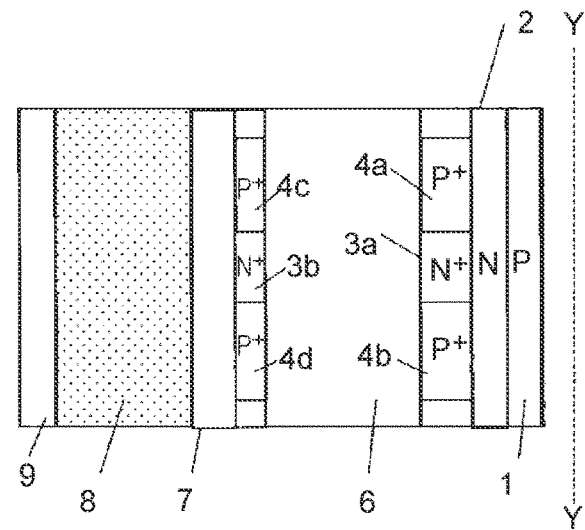

As shown in FIGS. 1AA to 1AC, an N layer 2 is formed on a P layer substrate 1 (an example of the "substrate" according to the scope of claims) by an epitaxial crystal growth method. An N$^+$ layer 3a, a P$^+$ layer 4a (an example of the "first impurity layer" according to the scope of claims), and a P$^+$ layer 4b (an example of the "fourth impurity layer" according to the scope of claims) are respectively formed by an epitaxial crystal growth method on a surface layer of the N layer 2. An i layer 6 (an example of the "first semiconductor layer" according to the scope of claims) is formed. An N$^+$ layer 3b, a P$^+$ layer 4c (an example of the "second impurity layer" according to the scope of claims), and a P$^+$ layer 4d (an example of the "fifth impurity layer" according to the scope of claims) are formed by an epitaxial crystal growth method on the i layer 6. A mask material layer 7 made up of, for example, a SiO$_2$ layer, an aluminum oxide (Al$_2$O$_3$, hereinafter referred to as AlO) layer, and a SiO$_2$ layer is formed. A silicon-germanium (SiGe) layer 8 is deposited. A mask material layer 9 made up of a SiO$_2$ layer and a SiN layer is deposited. Note that the i layer 6 may be formed of N-type or P-type Si containing a small amount of donor impurity atoms or acceptor impurity atoms. The N$^+$ layers 3a and 3b and the P$^+$ layers 4a, 4b, 4c, and 4d may be formed by other methods such as an ion implantation method. Furthermore, the mask material layers 7 and 9 may be formed of a single material layer or a plurality of material layers made of a SiO$_2$ layer, a SiN layer, an AlO layer, or other material layers. The P$^+$ layers 4a and 4b may be formed connected to each other in a plan view.

Figure 1B:
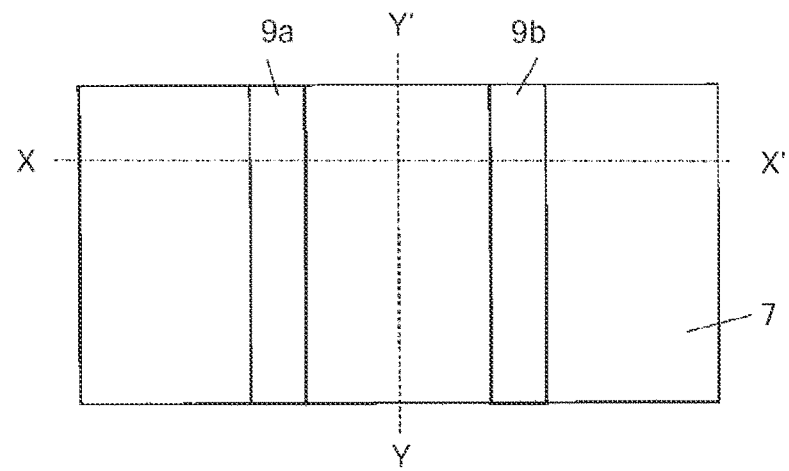
FIGS. 1BA, 1BB and 1BC are a plan view and a sectional structural diagram for explaining the manufacturing method of a pillar-shaped semiconductor device having an SGT according to the first embodiment.
Figure 1B:
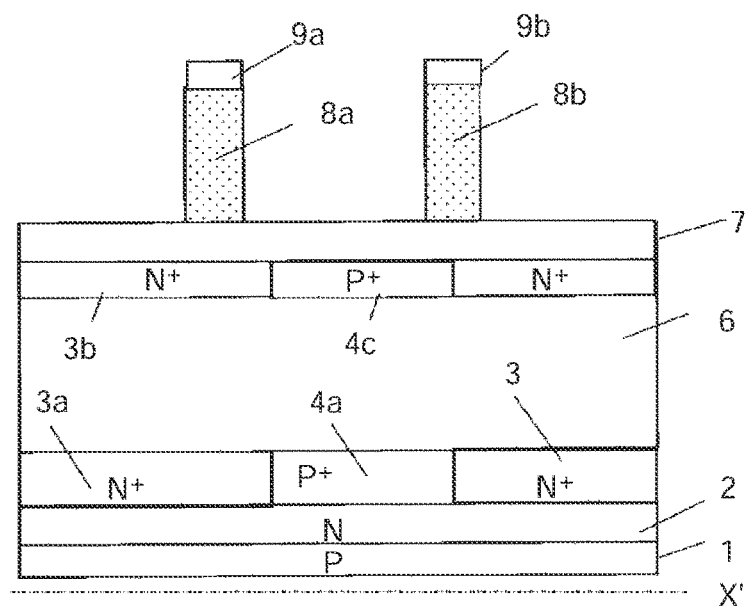
Figure 1B:
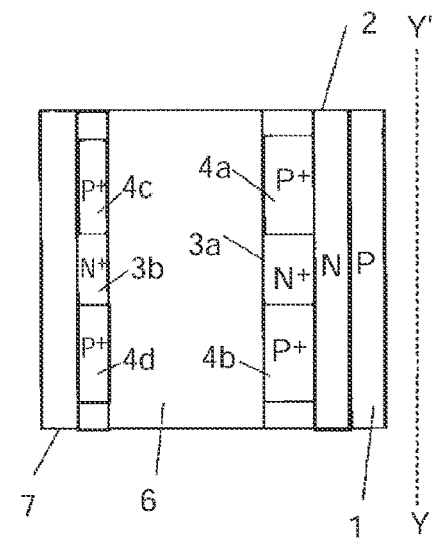

Next, using a band-shaped resist layer (not illustrated) formed by a lithographic method and extending in a Y direction in a plan view as a mask, the mask material layer 9 is etched by an RIE (Reactive Ion Etching) method. Using the resist layer as a mask, the mask material layer 9 is subjected to isotropic etching to form band-shaped mask material layers 9a and 9b. Accordingly, widths of the band-shaped mask material layers 9a and 9b are formed to be narrower than a minimum width of resist layers which can be formed by a lithographic method. Next, using the band-shaped mask material layers 9a and 9b as masks, band-shaped SiGe layers 8a and 8b are formed as shown in FIGS. 1BA to 1BC by etching the SiGe layer 8 by, for example, an RIE method.

Figure 1C:
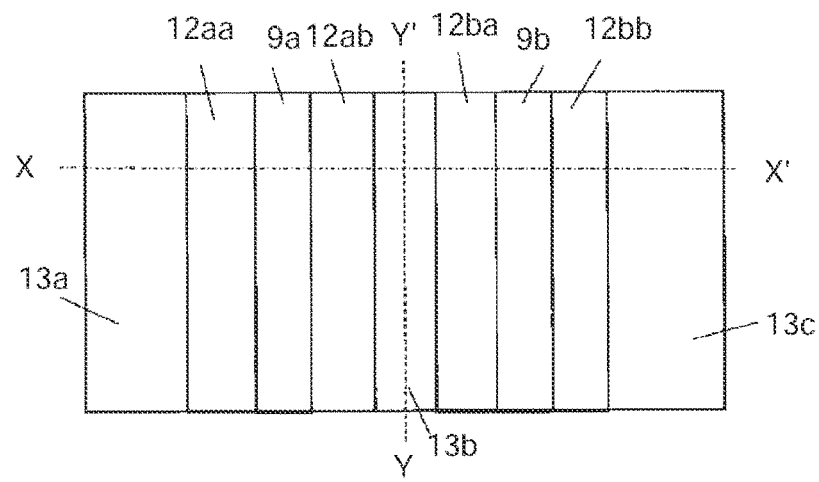
FIGS. 1CA, 1CB and 1CC are a plan view and a sectional structural diagram for explaining the manufacturing method of a pillar-shaped semiconductor device having an SGT according to the first embodiment.
Figure 1C:
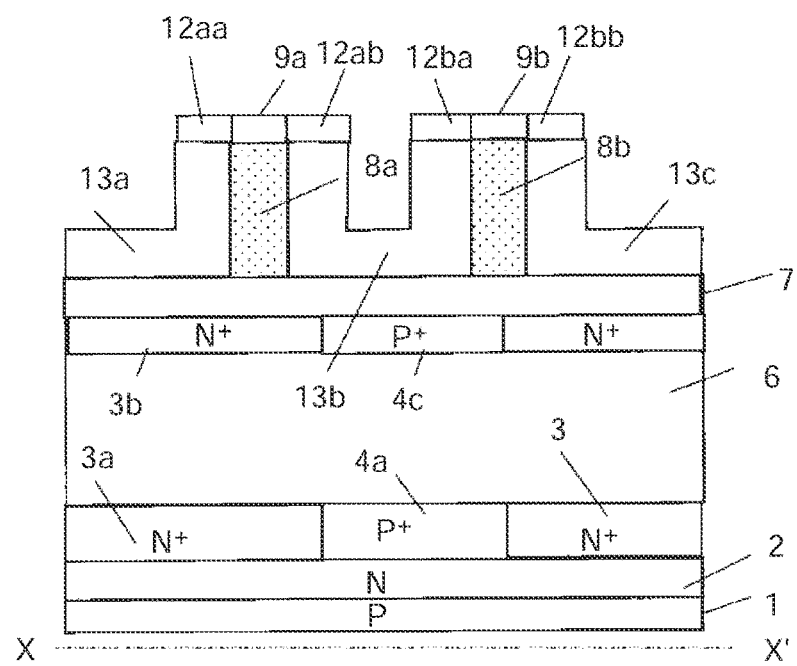
Figure 1C:
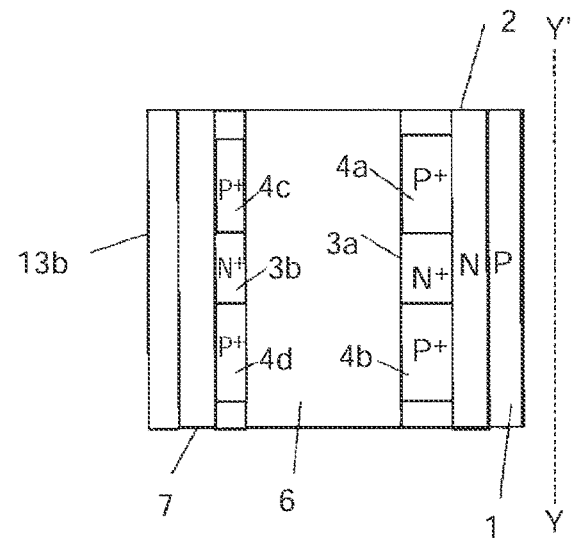

Next, a SiN layer (not illustrated) is formed on the entire stack by an ALD (Atomic Layered Deposition) method so as to cover the mask material layer 7, the band-shaped SiGe layers 8a and 8b, and the band-shaped mask material layers 9a and 9b. In this case, a cross section of the SiN layer is rounded in a top part thereof. The roundness is desirably formed above the band-shaped SiGe layers 8a and 8b. The entire stack is covered by a SiO$_2$ layer (not illustrated) by, for example, a flow CVD (Flow Chemical Vapor Deposition) method, and the SiO$_2$ layer and the SiN layer are polished by CMP (Chemical Mechanical Polishing) so that upper surface positions thereof equal upper surface positions of the band-shaped mask material layers 9a and 9b to form SiN layers 13a, 13b, and 13c. Top parts of the SiN layers 13a, 13b, and 13c are etched to form depressions. The depressions are formed so that positions of bottom parts of the depressions are at positions of lower parts of the band-shaped mask material layers 9a and 9b. The entire stack is coated by a SiN layer (not illustrated), and the entire SiN layer is polished so that an upper surface position of the SiN layer is equal to upper surface positions of the mask material layers 9a and 9b. The SiO$_2$ layer formed by flow CVD is removed. Accordingly, as shown in FIGS. 1CA to 1CC, band-shaped mask material layers 12aa, 12ab, 12ba, and 12bb having same shapes as shapes of top parts of the SiN layers 13a, 13b, and 13c in a plan view are formed on both sides of the band-shaped mask material layers 9a and 9b.

Figure 1D:
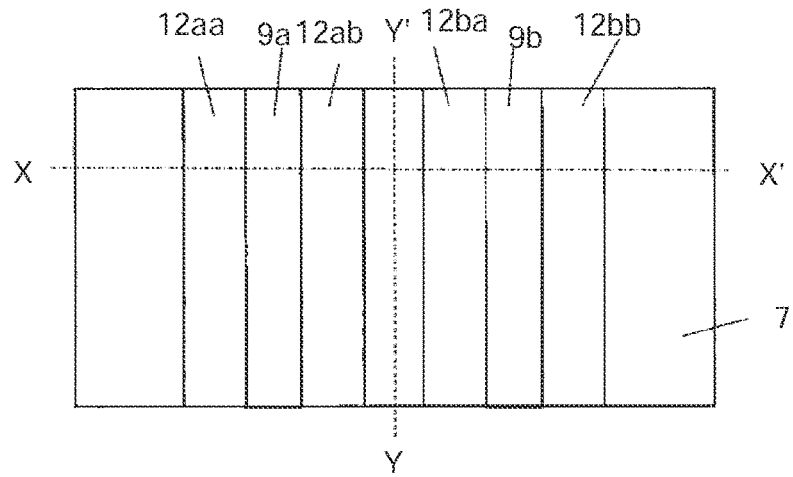
FIGS. 1DA, 1DB and 1DC are a plan view and a sectional structural diagram for explaining the manufacturing method of a pillar-shaped semiconductor device having an SGT according to the first embodiment.
Figure 1D:
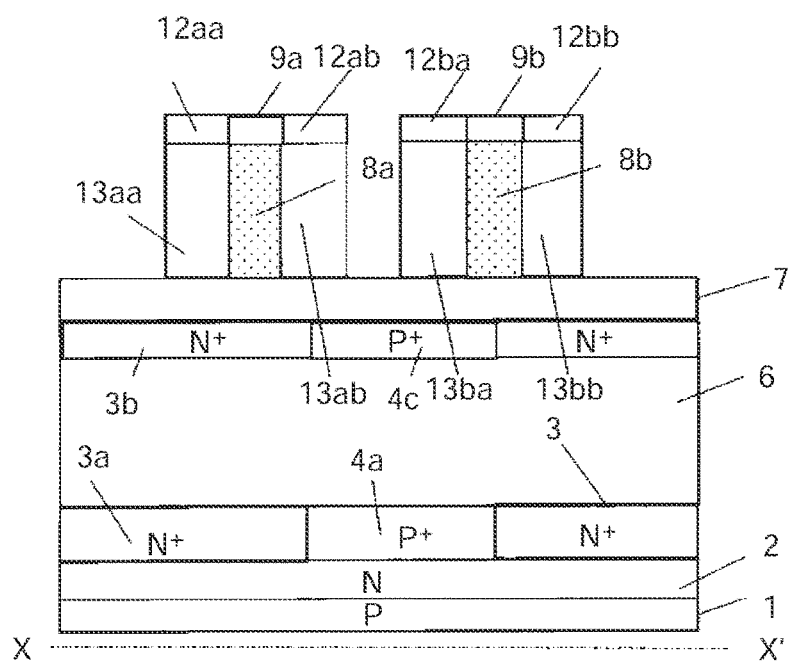
Figure 1D:
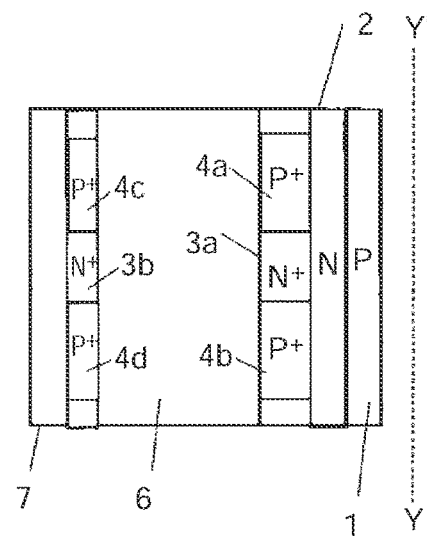

Next, as shown in FIGS. 1DA to 1DC, using the band-shaped mask material layers 9a, 9b, 12aa, 12ab, 12ba, and 12bb as masks, band-shaped SiN layers 13aa, 13ab, 13ba, and 13bb are formed by etching the SiN layers 13a, 13b, and 13c. In this case, widths of the band-shaped SiN layers 13aa, 13ab, 13ba, and 13bb are the same in a plan view.

Figure 1E:
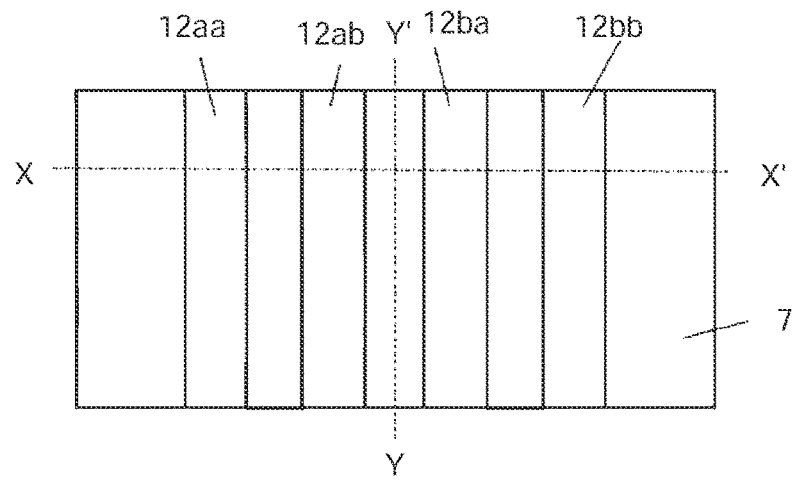
FIGS. 1EA, 1EB and 1EC are a plan view and a sectional structural diagram for explaining the manufacturing method of a pillar-shaped semiconductor device having an SGT according to the first embodiment.
Figure 1E:
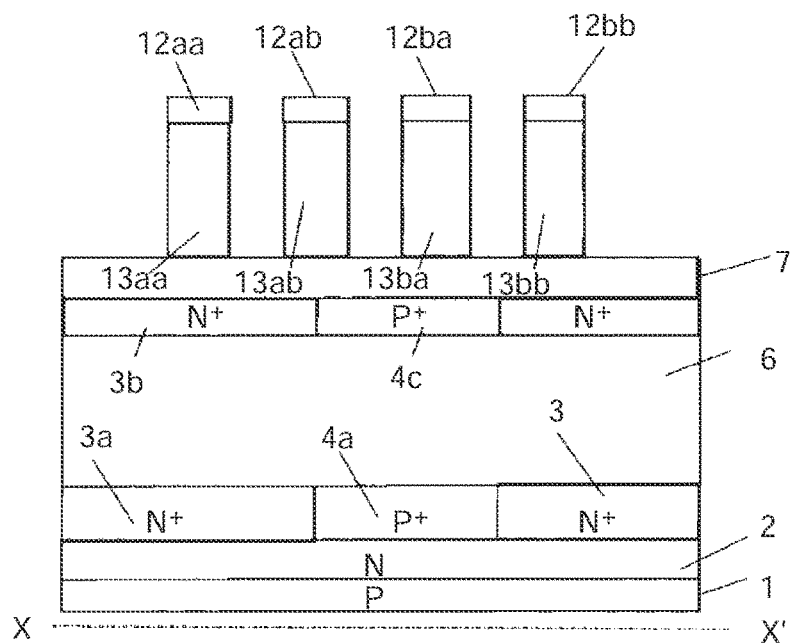
Figure 1E:
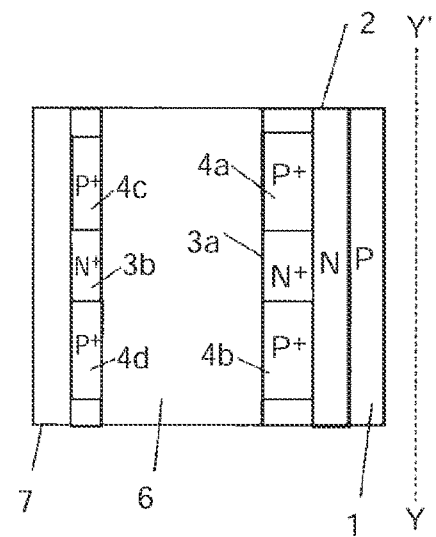

Next, the band-shaped mask material layers 9a and 9b and the band-shaped SiGe layers 8a and 8b are removed. Accordingly, as shown in FIGS. 1EA to 1EC, the band-shaped SiN layers 13aa, 13ab, 13ba, and 13bb which respectively have, in top parts thereof, the band-shaped mask material layers 12aa, 12ab, 12ba, and 12bb which extend in the Y direction in a plan view and which are arranged parallel to each other are formed on the mask material layer 7.

Figure 1F:
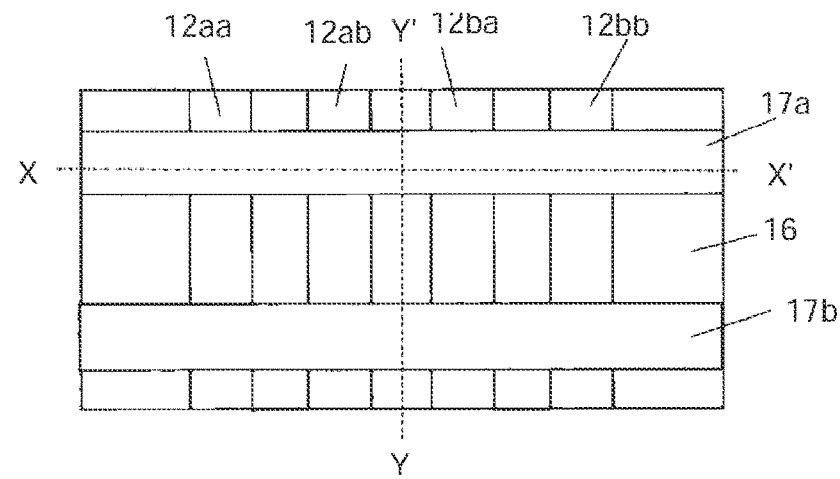
FIGS. 1FA, 1FB and 1FC are a plan view and a sectional structural diagram for explaining the manufacturing method of a pillar-shaped semiconductor device having an SGT according to the first embodiment.
Figure 1F:
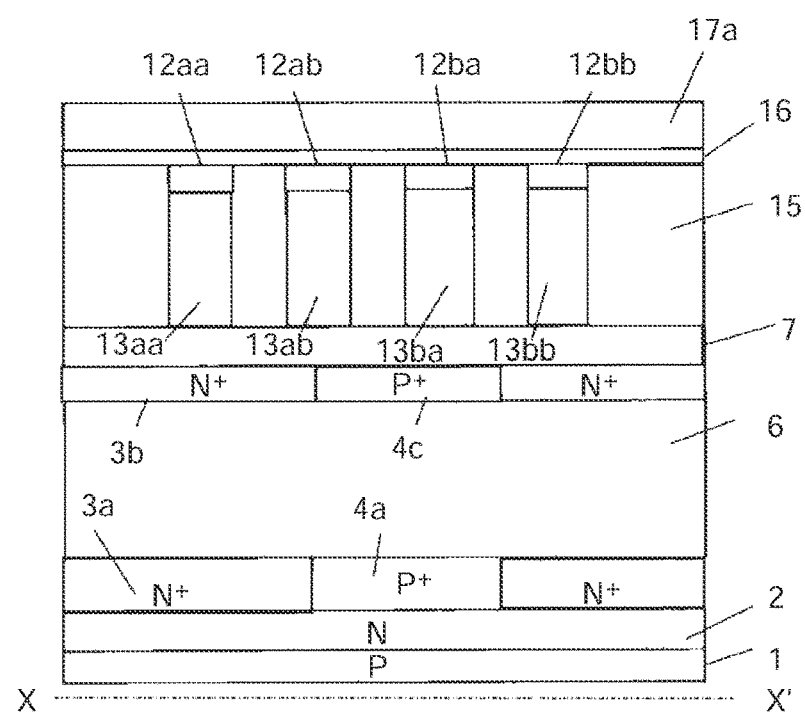
Figure 1F:
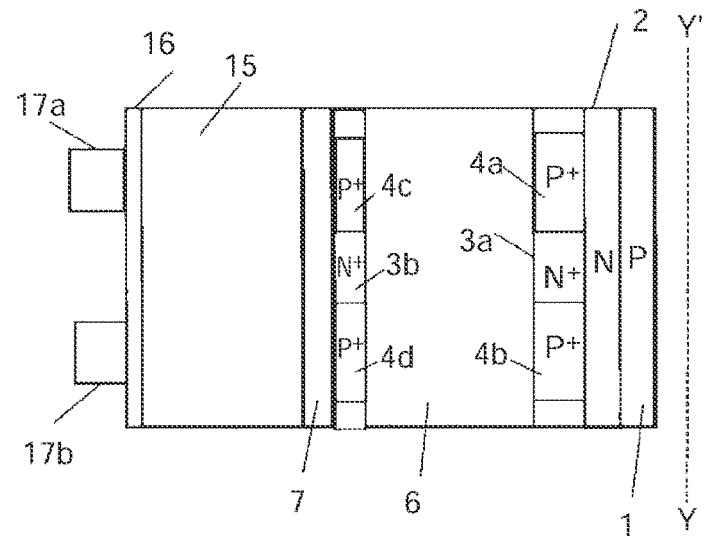

Next, a SiO$_2$ (not illustrated) by a flow CVD method is formed so as to cover the entire stack. The SiO$_2$ is polished by a CMP method so that an upper surface position thereof equals upper surface positions of the band-shaped mask material layers 12aa, 12ab, 12ba, and 12bb to form a SiO$_2$ layer 15 as shown in FIGS. 1FA to 1FC. A SiN layer 16 is formed on the SiO$_2$ layer 15 and the band-shaped mask material layers 12aa, 12ab, 12ba, and 12bb. Band-shaped mask material layers 17a and 17b which extend in the X direction and which are arranged parallel to each other are formed on the SiN layer 16 using a same basic method as the method used to form the band-shaped SiN layers 13aa, 13ab, 13ba, and 13bb.

Figure 1G:
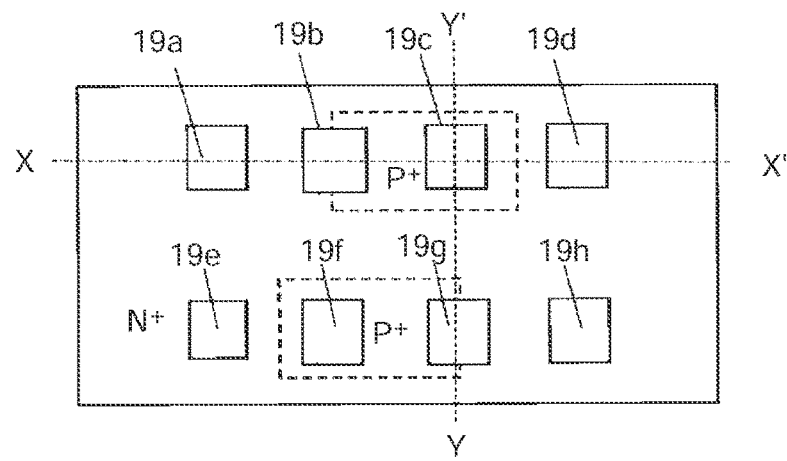
FIGS. 1GA, 1GB and 1GC are a plan view and a sectional structural diagram for explaining the manufacturing method of a pillar-shaped semiconductor device having an SGT according to the first embodiment.
Figure 1G:
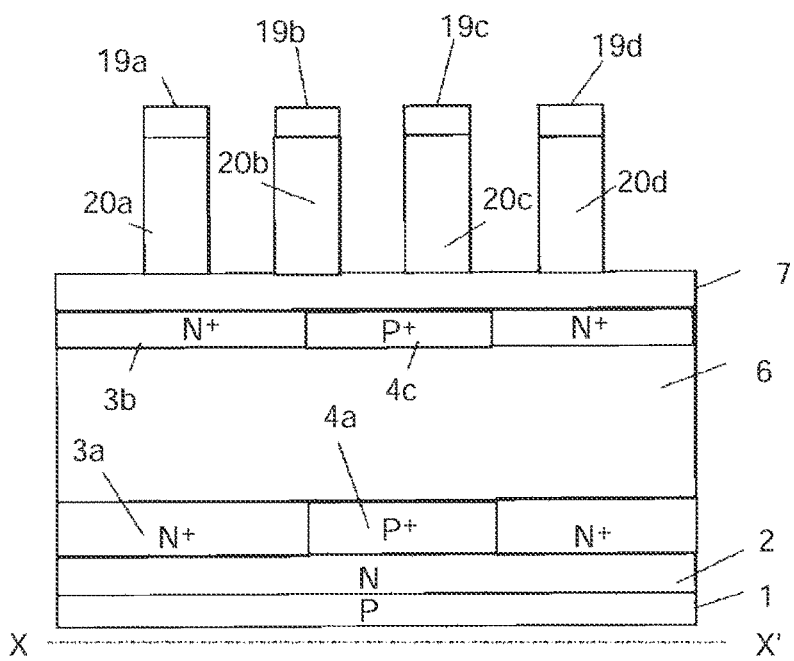
Figure 1G:
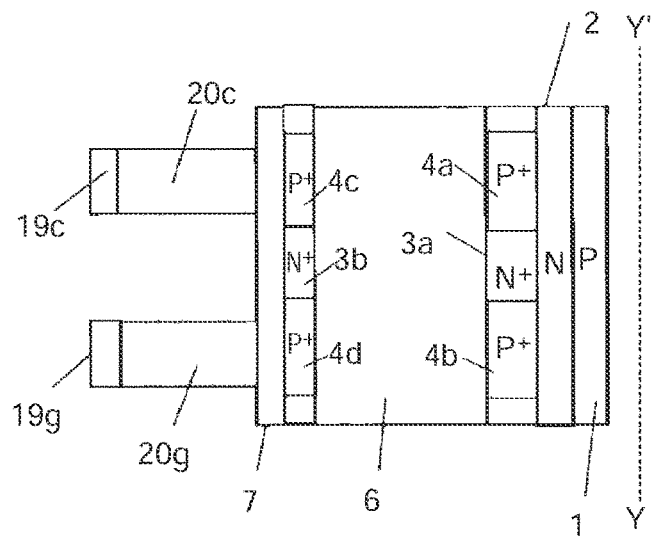

Next, as shown in FIGS. 1GA to 1GC, using the band-shaped mask material layers 17a and 17b as masks, the SiN layer 16, the band-shaped mask material layers 12aa, 12ab, 12ba, and 12bb, the band-shaped SiN layers 13aa, 13ab, 13ba, and 13bb, and the mask material layer 7 are subjected to RIE etching. The SiN layer 16 and the SiO$_2$ layer 15 which remain are removed. Accordingly, SiN pillars 20a, 20b, 20c, 20d, 20e, 20f, 20g, and 20h which have rectangular mask material layers 19a, 19b, 19c, 19d, 19e, 19f, 19g, and 19h in top parts thereof are formed in a plan view.

Figure 1H:
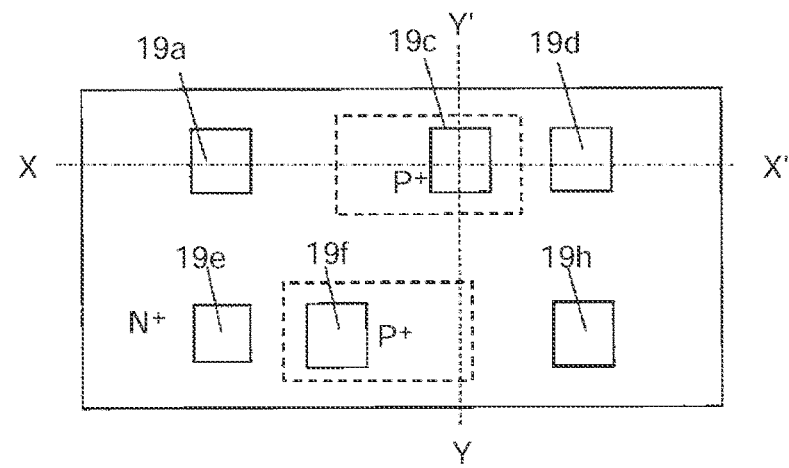
FIGS. 1HA, 1HB and 1HC are a plan view and a sectional structural diagram for explaining the manufacturing method of a pillar-shaped semiconductor device having an SGT according to the first embodiment.
Figure 1H:
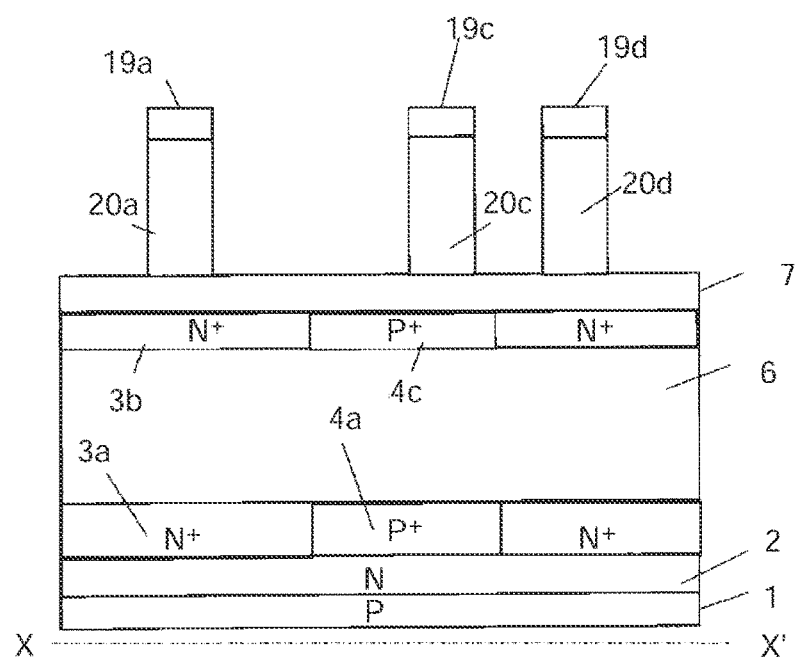
Figure 1H:
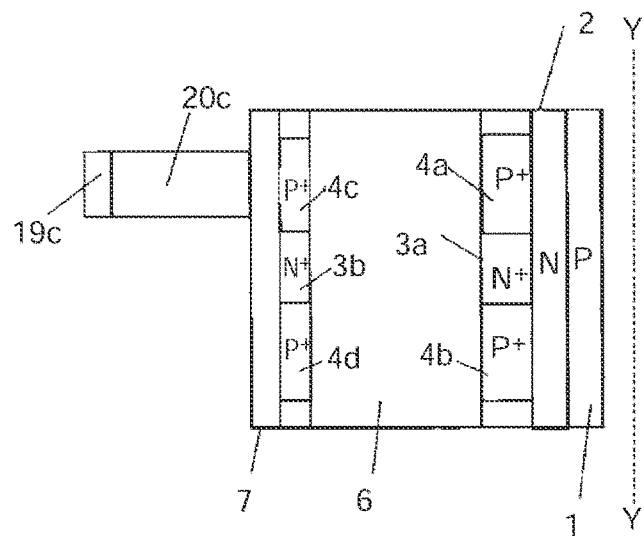

Next, as shown in FIGS. 1HA to 1HC, the rectangular mask material layers 19b and 19g and the SiN pillars 20b and 20g are removed.

Figure 1I:
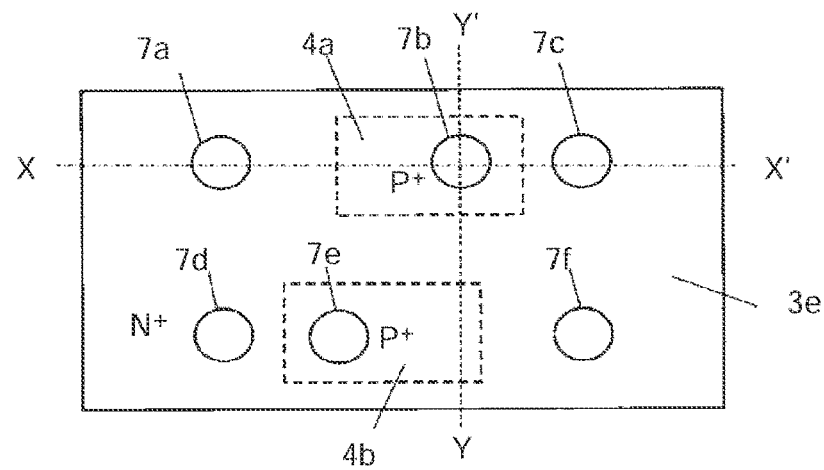
FIGS. 1IA, 1IB and 1IC are a plan view and a sectional structural diagram for explaining the manufacturing method of a pillar-shaped semiconductor device having an SGT according to the first embodiment.
Figure 1I:
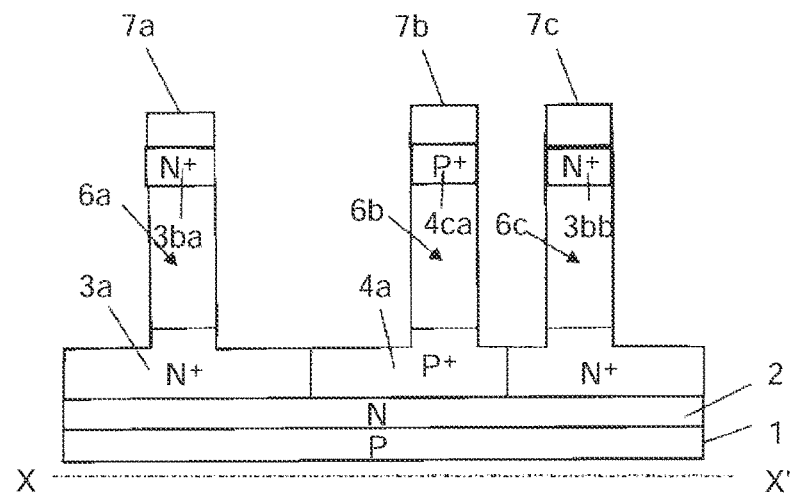
Figure 1I:
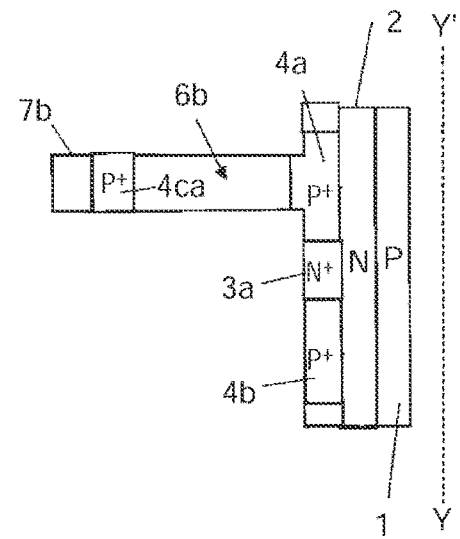

Next, using the mask material layers 19a, 19c, 19d, 19e, 19f, and 19h and the SiN pillars 20a, 20c, 20d, 20e, 20f, and 20h as masks, the mask material layer 7 is etched to form mask material layers 7a and 7b (an example of the "first material layer" according to the scope of claims), mask material layers 7c, 7d, and 7e (an example of the "third material layer" according to the scope of claims), and a mask material layer 7f as shown in FIGS. 1IA to 1IC. In the etching, by performing isotropic etching by, for example, a CDE (Chemical Dry Etching) method, the mask material layers 7a, 7b, 7c, 7d, 7e, and 7f are given a circular shape in a plan view. The CDE etching is not required if the shapes of the mask material layers 7a, 7b, 7c, 7d, 7e, and 7f in a plan view are circular shapes prior to this step. The mask material layers 19a, 19c, 19d, 19e, 19f, and 19h and the SiN pillars 20a, 20c, 20d, 20e, 20f, and 20h are removed. As shown in FIGS. 1IA to 1IC, using the mask material layers 7a, 7b, 7c, 7d, 7e, and 7f as masks, the N$^+$ layer 3a, the P$^+$ layers 4c and 4d, and the i layer 6 are etched to form Si pillars 6a and 6b (an example of the "first semiconductor pillar" according to the scope of claims), Si pillars 6c, 6d, and 6e (an example of the "second semiconductor pillar" according to the scope of claims), and a Si pillar 6f on the N$^+$ layer 3a and the P$^+$ layers 4a and 4b. An N$^+$ layer 3ba is formed in a top part of the Si pillar 6a, a P$^+$ layer 4ca is formed in a top part of the Si pillar 6b, an N$^+$ layer 3bb is formed in a top part of the Si pillar 6c, an N$^+$ layer 3Ba (not illustrated) is formed in a top part of the Si pillar 6d, a P$^+$ layer 3Ca (not illustrated) is formed in a top part of the Si pillar 6e, and an N$^+$ layer 3Bb (not illustrated) is formed in a top part of the Si pillar 6f.

Figure 1J:
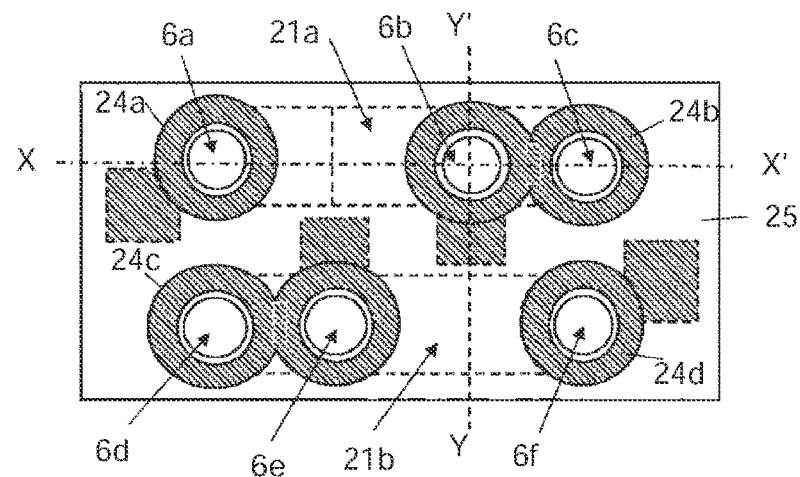
FIGS. 1JA, 1JB and 1JC are a plan view and a sectional structural diagram for explaining the manufacturing method of a pillar-shaped semiconductor device having an SGT according to the first embodiment.
Figure 1J:
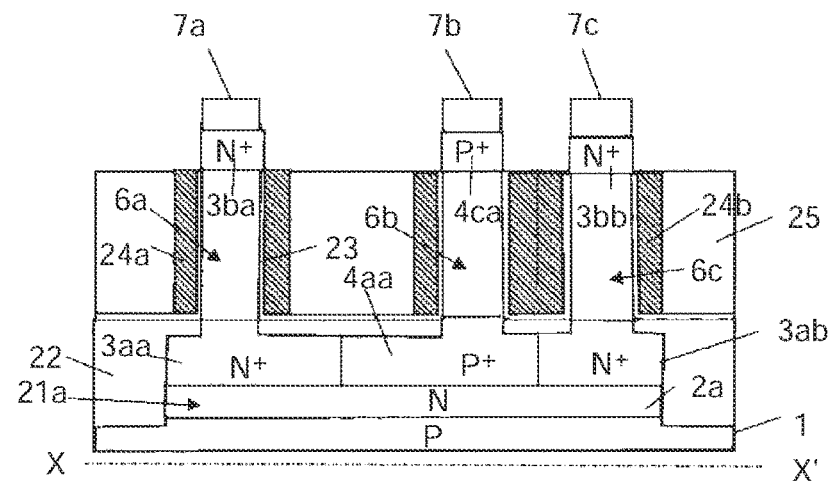
Figure 1J:
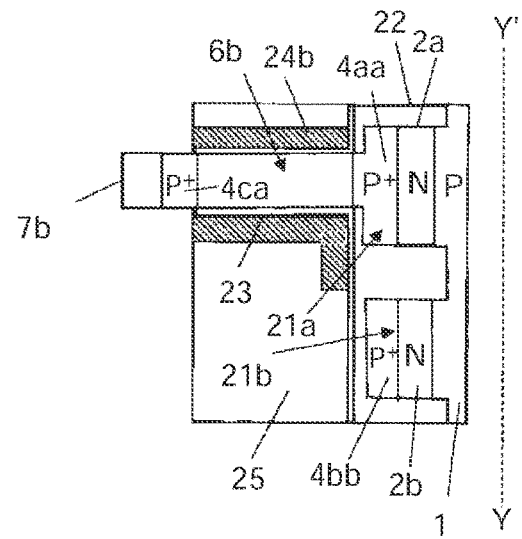

Next, as shown in FIGS. 1JA to 1JC, the N$^+$ layer 3a, the P$^+$ layer 4a, the N layer 2, and the P layer substrate 1 which are connected to bottom parts of the Si pillars 6a, 6b, and 6c are etched to form a Si pedestal 21a made up of an upper part of the P layer substrate 1, the N layer 2a, the N$^+$ layers 3aa and 3ab, and the P$^+$ layer 4aa. At the same time, the N$^+$ layer 3a, the P$^+$ layer 4b, the N layer 2, and the P layer substrate 1 which are connected to bottom parts of the Si pillars 6d, 6e, and 6f are etched to form a Si pedestal 21b made up of an upper part of the P layer substrate 1, the N layer 2b, the N$^+$ layers 3aB (not illustrated) and 3bB (not illustrated), and the P$^+$ layer 4bb. A SiO$_2$ layer 22 is formed in outer circumferential parts of the N$^+$ layers 3aa, 3ab, 3aB, and 3bB, the P$^+$ layers 4aa and 4bb, and the N layers 2a and 2b and on the P layer substrate 1. A HfO$_2$ layer 23 (an example of the "gate insulating layer" according to the scope of claims) and a TiN layer (not illustrated) are formed by an ALD method so as to cover the entire stack. In this case, TiN layers are in contact with each other by side surfaces thereof between the Si pillars 6b and 6c and the Si pillars 6d and 6e. A TiN layer 24a is formed on the HfO$_2$ layer 23 surrounding an outer circumference of the Si pillar 6a, a TiN layer 24b (an example of the "gate conductor layer" according to the scope of claims) is formed so as to surround the HfO$_2$ layer 23 in outer circumferences of the Si pillars 6b and 6c, a TiN layer 24c (an example of the "gate conductor layer" according to the scope of claims) is formed so as to surround the HfO$_2$ layer 23 in outer circumferences of the Si pillars 6d and 6e, and a TiN layer 24d is formed so as to surround the HfO$_2$ layer 23 in an outer circumference of the Si pillar 6f. The entire stack is coated by a SiO$_2$ layer (not illustrated) and, subsequently, the entire stack is polished by a CMP method so that an upper surface position is equal to upper surface positions of the mask material layers 7a, 7b, 7c, 7d, 7e, and 7f. A planarized SiO$_2$ layer (not illustrated) is etched back by an RIE method to form a SiO$_2$ layer 25. Using the mask material layers 7a, 7b, 7c, 7d, 7e, and 7f and the SiO$_2$ layer 25 as a mask, top parts of the HfO$_2$ layer 23 and the TiN layers 24a, 24b, 24c, and 24d are removed. The TiN layers 24a, 24b, 24c, and 24d are to become a gate conductor layer of the SGT. The gate conductor layer is a layer which contributes toward setting a threshold voltage of the SGT and may be formed of a gate conductor layer made of a single layer or made up of a plurality of layers. The gate conductor material layer is formed in contact with entire side surfaces between the Si pillars 6b and 6c and between the Si pillars 6d and 6e. Alternatively, for example, a tungsten (W) layer connected to the TiN layers 24a, 24b, 24c, and 24d may be formed and the layers including the W layer may be used as a gate conductor layer. The W layer may be another conductor material layer.

Figure 1K:
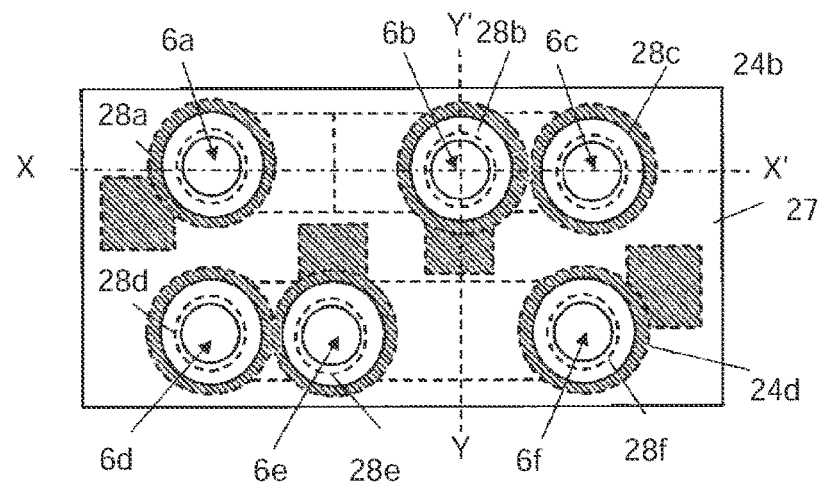
FIGS. 1KA, 1KB and 1KC are a plan view and a sectional structural diagram for explaining the manufacturing method of a pillar-shaped semiconductor device having an SGT according to the first embodiment.
Figure 1K:
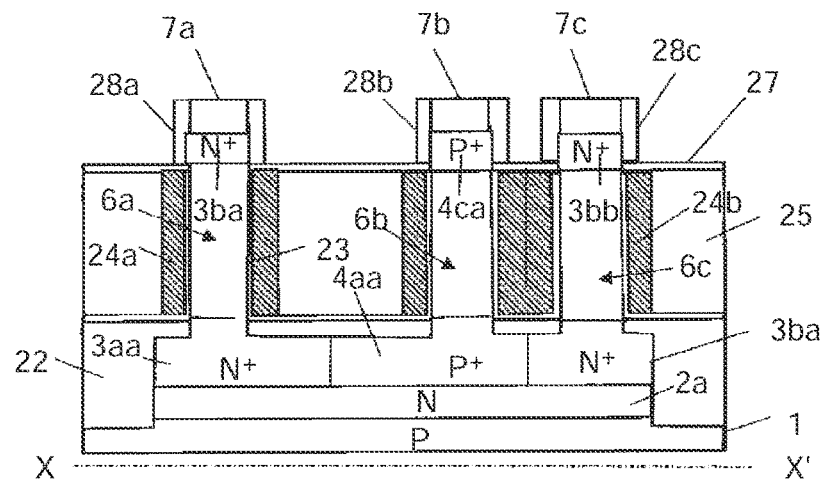
Figure 1K:
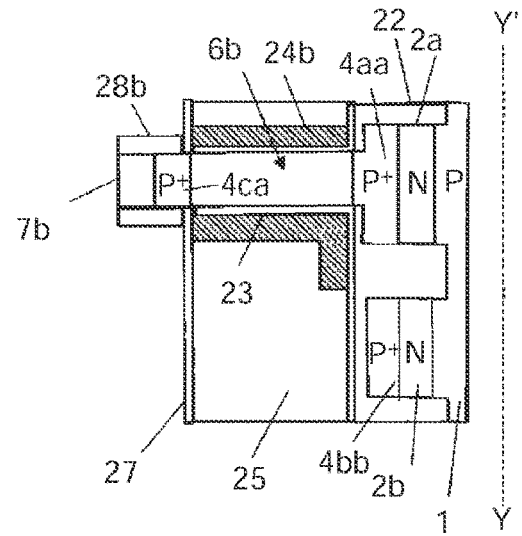

Next, as shown in FIGS. 1KA to 1KC, a SiN layer 27 (an example of the "first interlayer insulating layer" according to the scope of claims) is formed on the SiO$_2$ layer 25 in the outer circumferential parts of the Si pillars 6a to 6f. The entire stack is coated by a SiO$_2$ layer (not illustrated). By etching the SiO$_2$ layer by an RIE method, SiO$_2$ layers 28a and 28b (an example of the "second material layer" according to the scope of claims), SiO$_2$ layers 28c, 28d, and 28e (an example of the "fourth material layer" according to the scope of claims), and a SiO$_2$ layer 28f having fixed widths in a plan view are formed in the exposed top parts of the Si pillars 6a to 6f and the side surfaces of the mask material layers 7a to 7f. In this case, the SiO$_2$ layer 28b and the SiO$_2$ layer 28c are formed separated from each other. In a similar manner, the SiO$_2$ layer 28d and the SiO$_2$ layer 28e are formed separated from each other. Note that the SiN layer 27 need only be at least formed on the TiN layers 24a, 24b, 24c, and 24d which are gate conductor layers. Instead of forming the SiN layer 27 separately from the SiO$_2$ layer 25, after forming the gate TiN layers 24a to 24d, a SiN layer may be deposited on the entire stack, the SiN layer may be polished by CMP so that an upper surface position thereof equals upper surface positions of the mask material layers 7a to 7f, and the SiN layer may be formed by an RIE method so that the upper surface position thereof is higher than upper end positions of the gate TiN layers 24a to 24d.

Figure 1L:
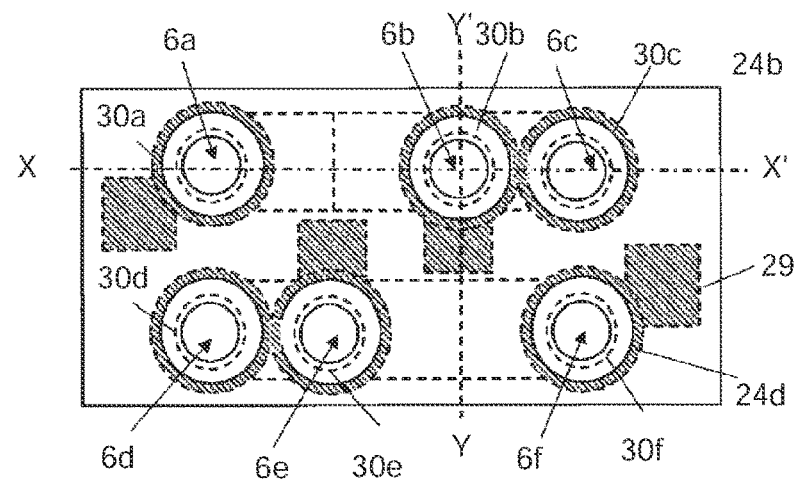
FIGS. 1LA, 1LB and 1LC are a plan view and a sectional structural diagram for explaining the manufacturing method of a pillar-shaped semiconductor device having an SGT according to the first embodiment.
Figure 1L:
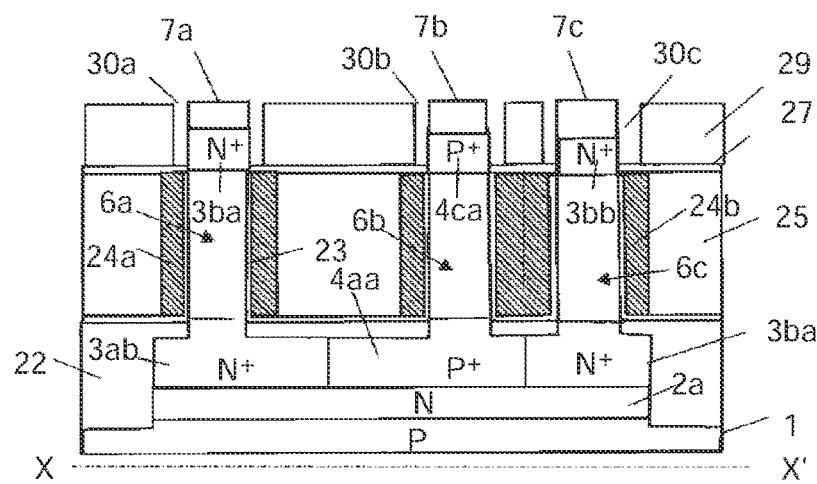
Figure 1L:
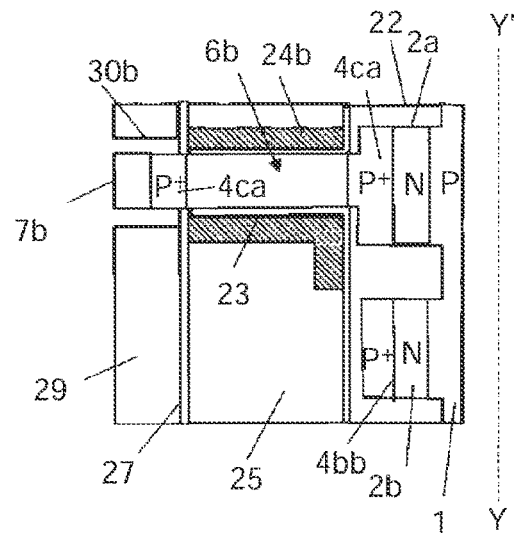

Next, the entire stack is coated by an aluminum oxide (AlO) layer (not illustrated). As shown in FIGS. 1LA to 1LC, the AlO layer is polished by a CMP method so that an upper surface position of the AlO layer equals upper surface positions of the mask material layers 7a to 7f to form an AlO layer 29 (an example of the "second interlayer insulating layer" according to the scope of claims). The SiO$_2$ layers 28a, 28b, 28c, 28d, 28e, and 28f which surround the top parts of the Si pillars 6a to 6f are removed to form depressions 30a, 30b, 30c, 30d, 30e, and 30f which surround the top parts of the Si pillars 6a to 6f. Since the SiO$_2$ layers 28a, 28b, 28c, 28d, 28e, and 28f are formed by self-alignment with respect to the Si pillars 6a to 6f, the depressions 30a, 30b, 30c, 30d, 30e, and 30f are formed by self-alignment with respect to the Si pillars 6a to 6f. Note that the AlO layer 29 may be formed of a single other material layer or a plurality of other material layers.

Figure 1M:
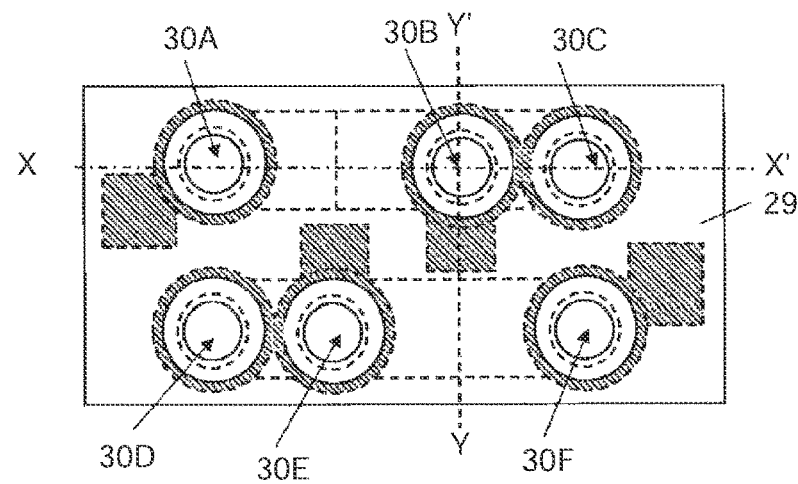
FIGS. 1MA, 1MB and 1MC are a plan view and a sectional structural diagram for explaining the manufacturing method of a pillar-shaped semiconductor device having an SGT according to the first embodiment.
Figure 1M:
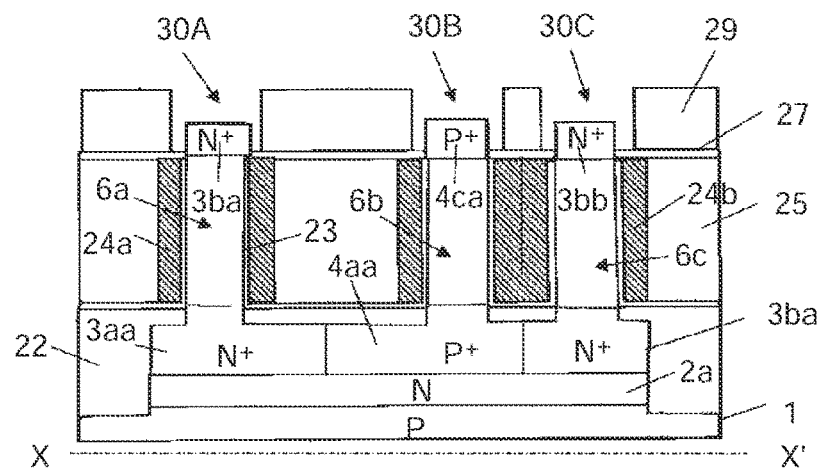
Figure 1M:
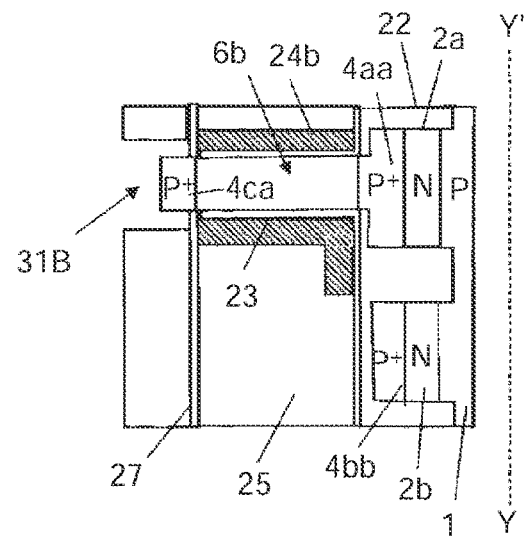

Next, as shown in FIGS. 1MA to 1MC, the mask material layers 7a, 7b, 7c, 7d, 7e, and 7f are removed to form depressions 30A and 30B (an example of the "first depression" according to the scope of claims), depressions 30C, 30D, and 30E (an example of the "second depression" according to the scope of claims), and a depression 30F on the outer circumference and the upper part of the top parts of the Si pillars 6a to 6f. Note that whichever of the $SiO_2$ layers 28a, 28b, 28c, 28d, 28e, and 28f and the mask material layers 7a, 7b, 7c, 7d, 7e, and 7f may be removed first.

Figure 1N:
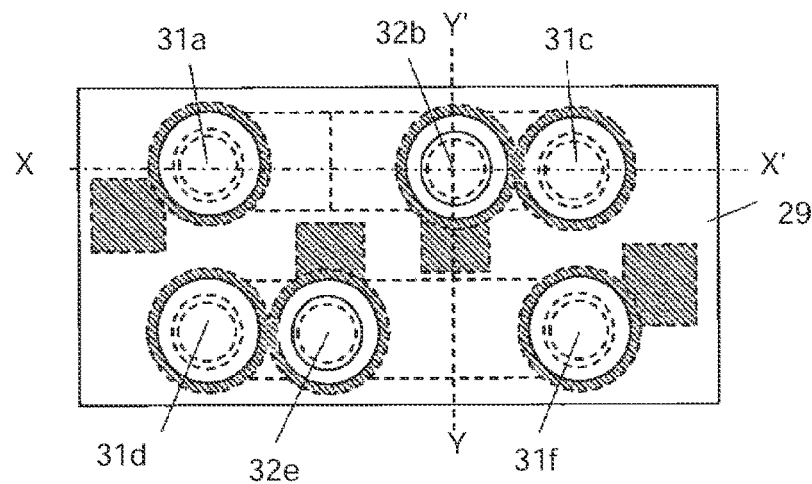
FIGS. 1NA, 1NB and 1NC are a plan view and a sectional structural diagram for explaining the manufacturing method of a pillar-shaped semiconductor device having an SGT according to the first embodiment.
Figure 1N:
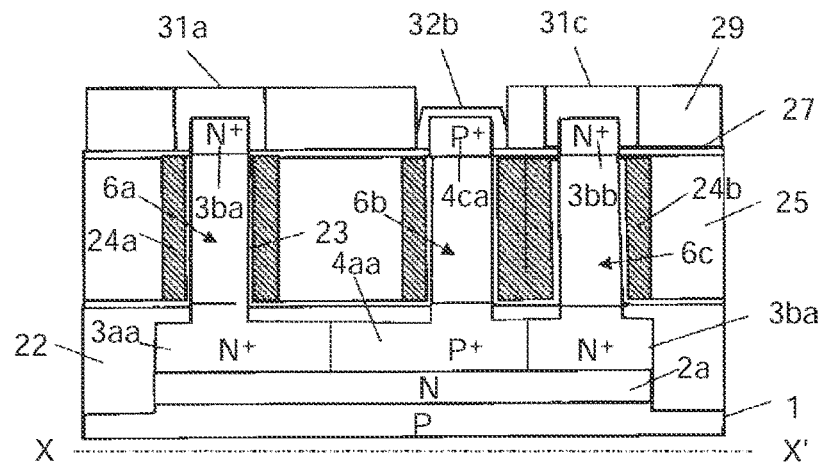
Figure 1N:
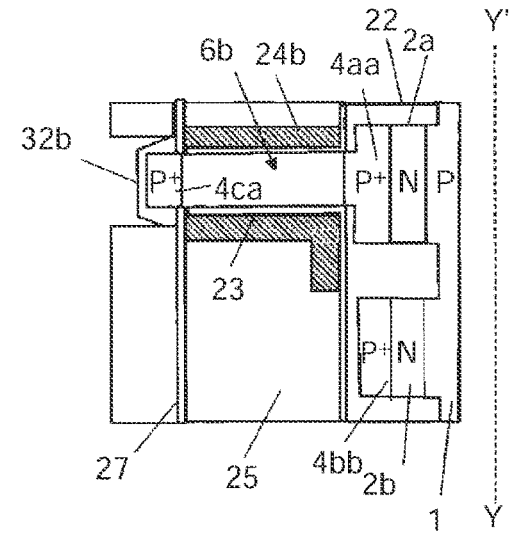
Figure 10A:
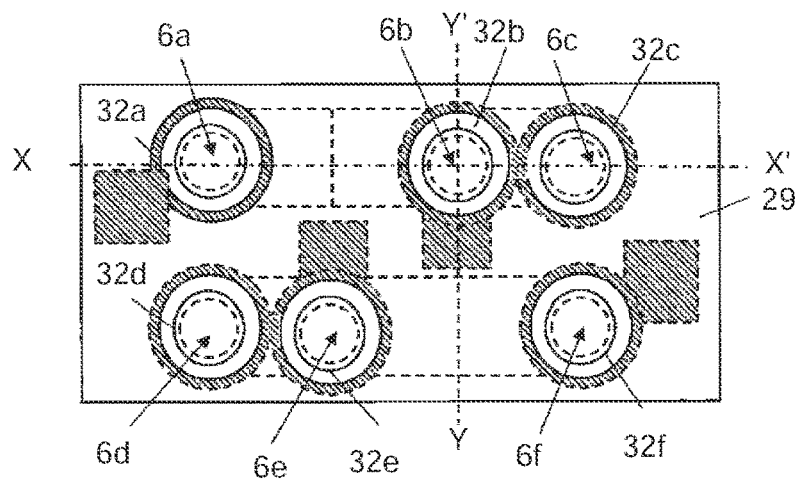
Figure 10B:
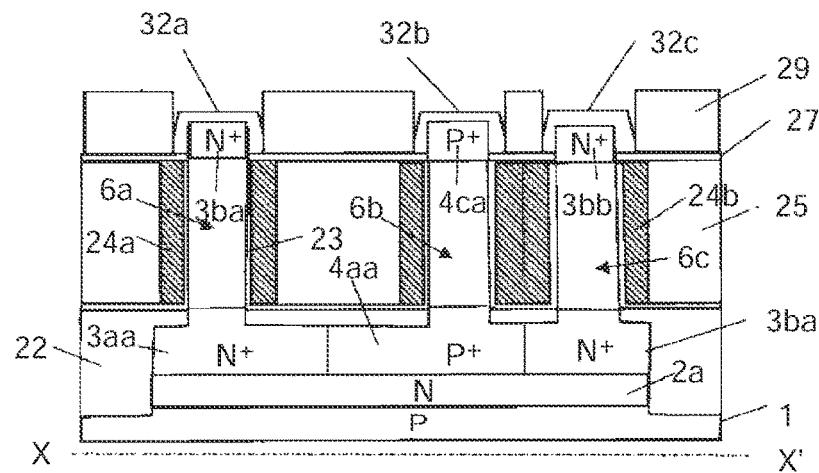
Figure 10C:
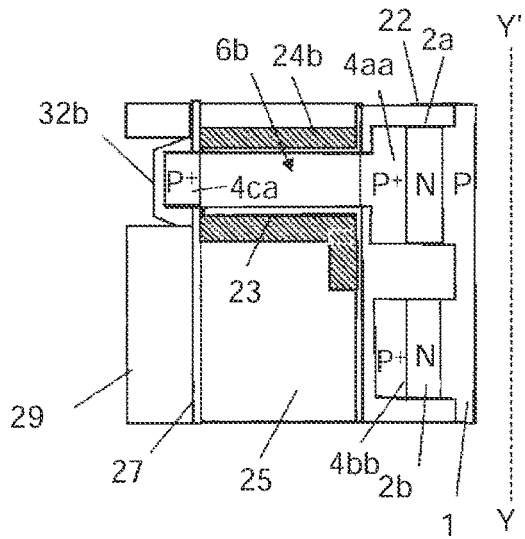

Next, the entire stack is coated by a $SiO_2$ layer (not illustrated) by a CVD method. As shown in FIGS. 1NA to 1NC, an upper surface position of the $SiO_2$ layer is polished to the upper surface position of the AlO layer 29 to form $SiO_2$ layers 31a, 31b (not illustrated), 31c, 31d, 31e (not illustrated), and 31f so as to cover the top parts of the Si pillars 6a to 6f and inside the depressions 30A, 30B, 30C, 30D, 30E, and 30F. The $SiO_2$ layers 31b and 31e are removed by a lithographic method and a chemical etching method. A $P^+$ layer 32b (an example of the "third impurity layer" according to the scope of claims) and a $P^+$ layer 32e (an example of the "sixth impurity layer" according to the scope of claims) which contain acceptor impurities are formed by a selective epitaxial crystal growth method so as to cover the top parts of the Si pillars 6b and 6e and inside the depressions 30B and 30E. Note that, desirably, before forming the $P^+$ layers 32b and 32e, processing of thinly oxidizing the top parts of the Si pillars 6b and 6e and then removing the oxide films is performed so as to remove and clean damaged layers among the surface layers of the top parts of the Si pillars 6b and 6e. As the $P^+$ layers 32b and 32e, single-crystal $P^+$ layers 32b and 32e may be formed using a method other than a selective epitaxial crystal growth method such as a molecular beam crystal growth method. Alternatively, the $P^+$ layers 32b and 32e may be formed by applying a coat of a semiconductor layer containing acceptor impurities over its entire surface, polishing the semiconductor layer by a CMP method so that an upper surface thereof equals the upper surface position of the AlO layer 29, and subjecting the upper surface to a CDE method or chemical etching.

Next, the entire stack is coated with a $SiO_2$ layer (not illustrated), and by polishing the $SiO_2$ layer by a CMP method so that an upper surface of the $SiO_2$ layer equals the upper surface position of the AlO layer 29, the $P^+$ layers 32b and 32e are coated by a $SiO_2$ layer (not illustrated). The $SiO_2$ layers 31a, 31c, 31d, and 31f are removed by a lithographic method and a chemical etching method. As shown in FIGS. 1OA to 1OC, $N^+$ layers 32a, 32c, 32d, and 32f containing donor impurities are formed by a selective epitaxial crystal growth method so as to cover the top parts of the Si pillars 6a, 6c, 6d, and 6f and inside the depressions 30A, 30C, 30D, and 30F. The $N^+$ layers 32a, 32c, 32d, and 32f are desirably formed so that outer circumferences of the $N^+$ layers 32a, 32c, 32d, and 32f do not protrude more outward than outer circumferences of the depressions 30A, 30C, 30D, and 30F in a plan view. The $SiO_2$ layer on the $P^+$ layers 32b and 32e is removed.

Figure 1P:
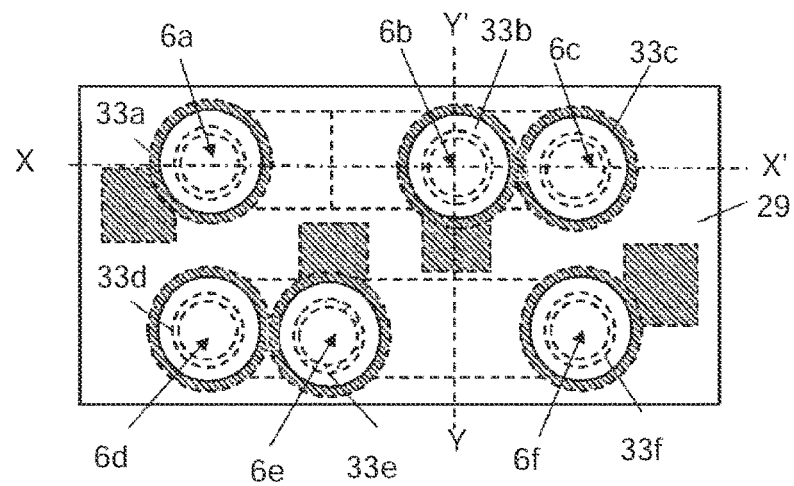
FIGS. 1PA, 1PB and 1PC are a plan view and a sectional structural diagram for explaining the manufacturing method of a pillar-shaped semiconductor device having an SGT according to the first embodiment.
Figure 1P:
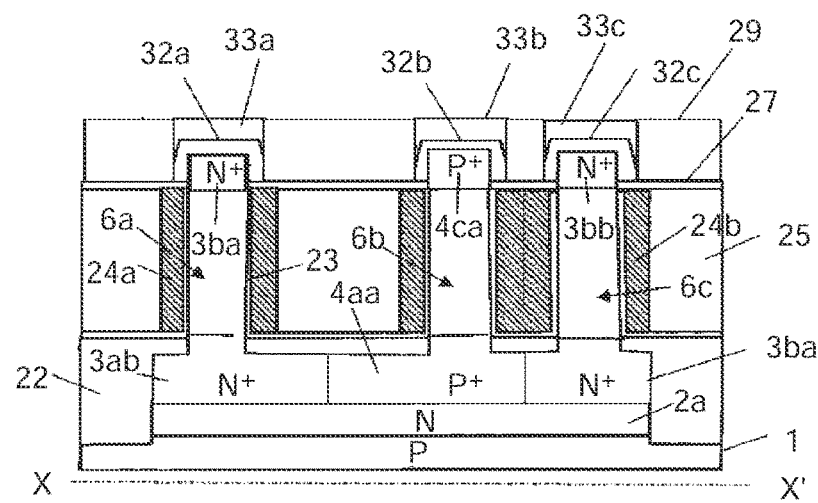
Figure 1P:
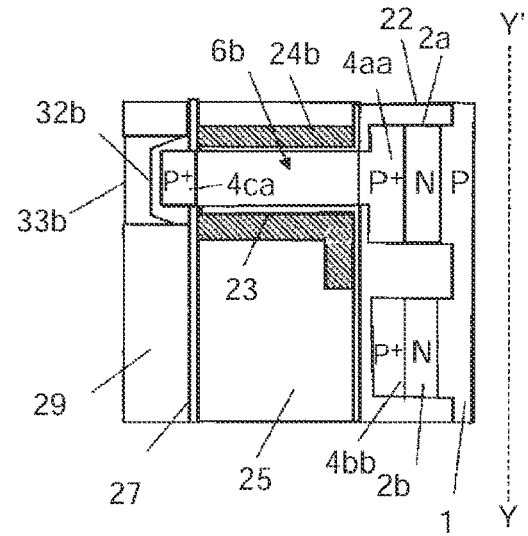

Next, the entire stack is coated by a thin Ta layer (not illustrated) and a W layer (not illustrated). As shown in FIGS. 1PA to 1PC, the W layer is polished by a CMP method so that an upper surface position of the W layer equals the upper surface position of the AlO layer 29 to form W layers 33a and 33b (an example of the "first conductor layer" according to the scope of claims), W layers 33c, 33d, and 33e (an example of the "second conductor layer" according to the scope of claims), and a W layer 33f which have Ta layers on a side surface and in a bottom part thereof. In this case, the Ta layers between the $N^+$ layers 32a, 32c, 32d, and 32f and the $P^+$ layers 32b and 32e and the W layers 33a, 33b, 33c, 33d, 33e, and 33f are buffer layers for reducing contact resistance between the two layers. The buffer layer may be a single other material layer or a plurality of other material layers.

Figure 1Q:
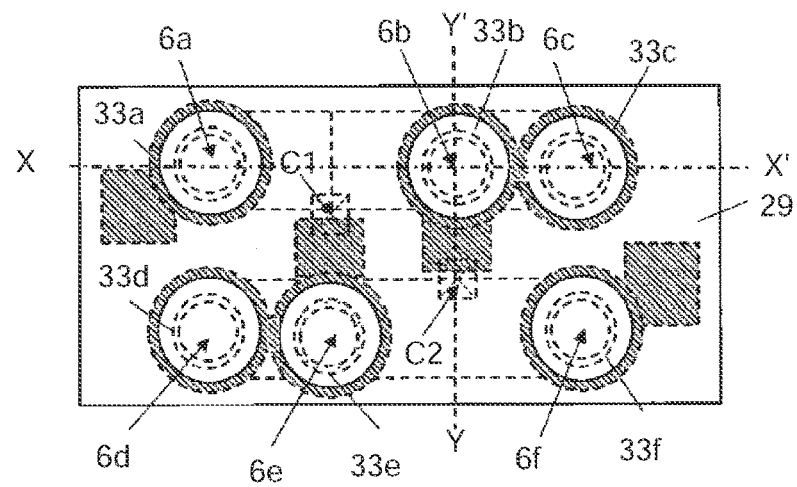
FIGS. 1QA, 1QB and 1QC are a plan view and a sectional structural diagram for explaining the manufacturing method of a pillar-shaped semiconductor device having an SGT according to the first embodiment.
Figure 1Q:
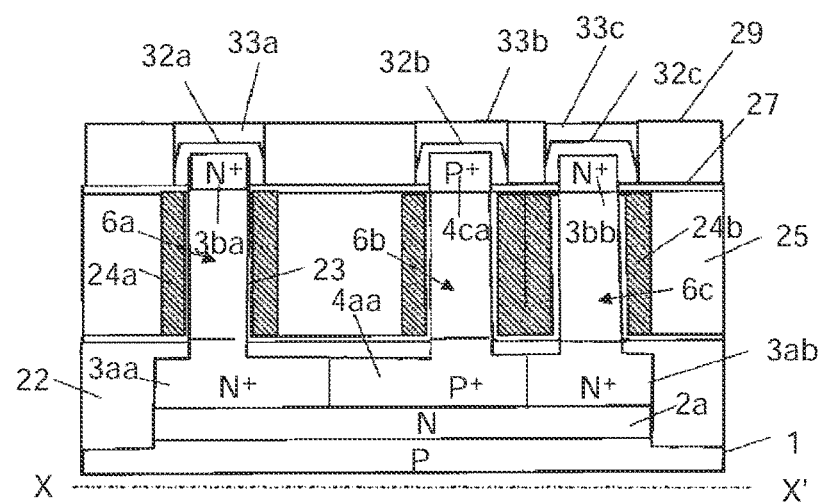
Figure 1Q:
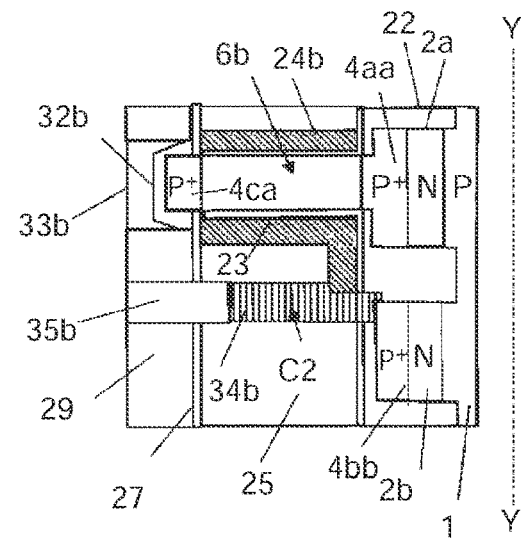

Next, as shown in FIGS. 1QA to 1QC, a contact hole C1 is formed on the TiN layer 24c, the $N^+$ layer 3aa, and the $P^+$ layer 4aa. At the same time, a contact hole C2 is formed on the TiN layer 24b, the $N^+$ layer 3bB, and the $P^+$ layer 4bb. The entire stack is coated by a thin buffer Ti layer (not illustrated) and a W layer (not illustrated). The W layer is etched back by RIE so that an upper surface position of the W layer becomes lower than upper surface positions of the contact holes C1 and C2 to form W layers 34a (not illustrated) and 34b inside the contact holes C1 and C2. The entire stack is coated by a SiN layer (not illustrated). The SiN layer is polished by a CMP method so that an upper surface position of the SiN layer equals upper surface positions of the W layers 33a, 33b, 33c, 33d, and 33f to form SiN layers 35a (not illustrated) and 35b on the W layer 34a inside the contact hole C1 and on the W layer 34b inside the contact hole C2.

Figure 1R:
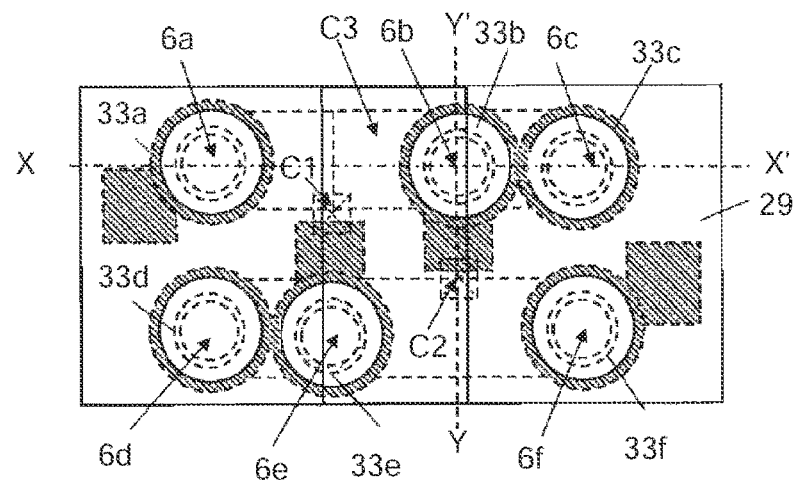
FIGS. 1RA, 1RB and 1RC are a plan view and a sectional structural diagram for explaining the manufacturing method of a pillar-shaped semiconductor device having an SGT according to the first embodiment.
Figure 1R:
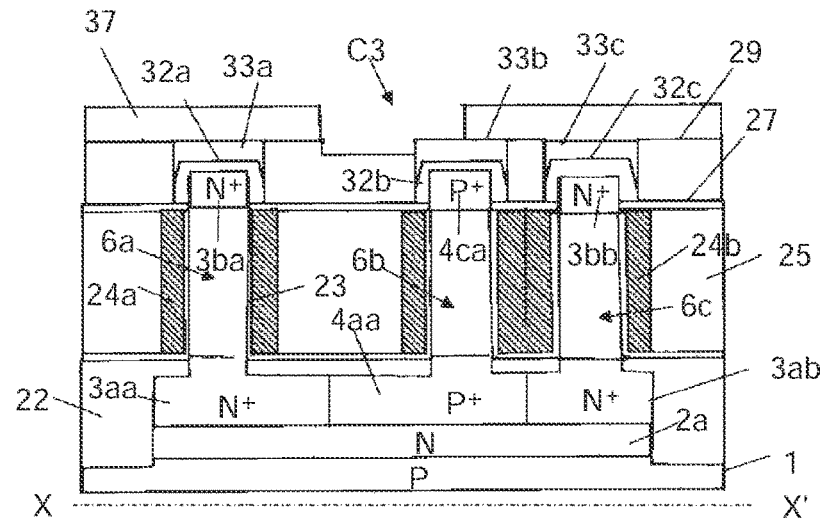
Figure 1R:
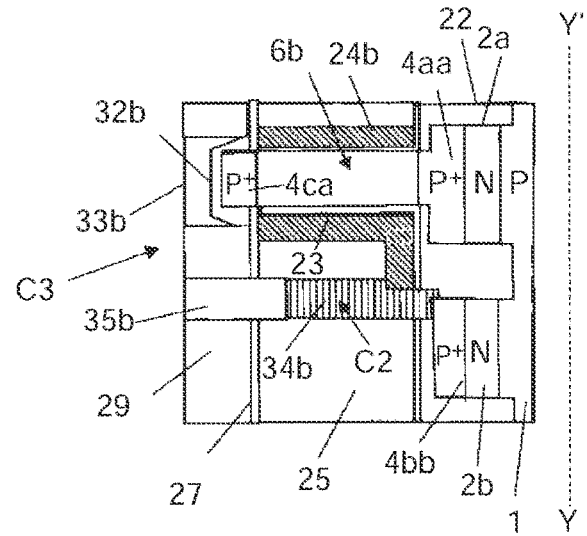

Next, the entire stack is coated by a $SiO_2$ layer (not illustrated). As shown in FIGS. 1RA to 1RC, after forming a $SiO_2$ layer 37 (an example of the "third interlayer insulating layer" according to the scope of claims) on the entire stack, a band-shaped contact hole C3 (an example of the "first band-shaped contact hole" according to the scope of claims) which overlaps with at least a part of the W layers 33b and 33e on the Si pillars 6b and 6e and which extends in the Y direction in a plan view is formed using a lithographic method and an RIE method. Note that a bottom part of the band-shaped contact hole C3 may reach the upper surface of the SiN layer 27.

Figure 1S:
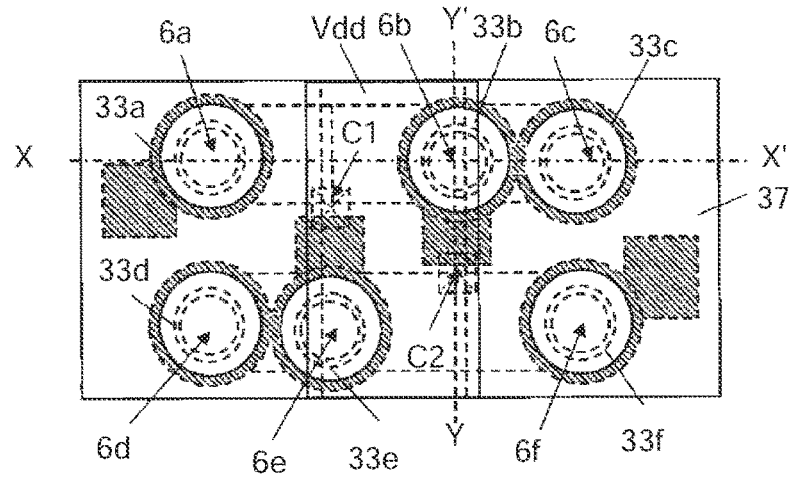
FIGS. 1SA, 1SB and 1SC are a plan view and a sectional structural diagram for explaining the manufacturing method of a pillar-shaped semiconductor device having an SGT according to the first embodiment.
Figure 1S:
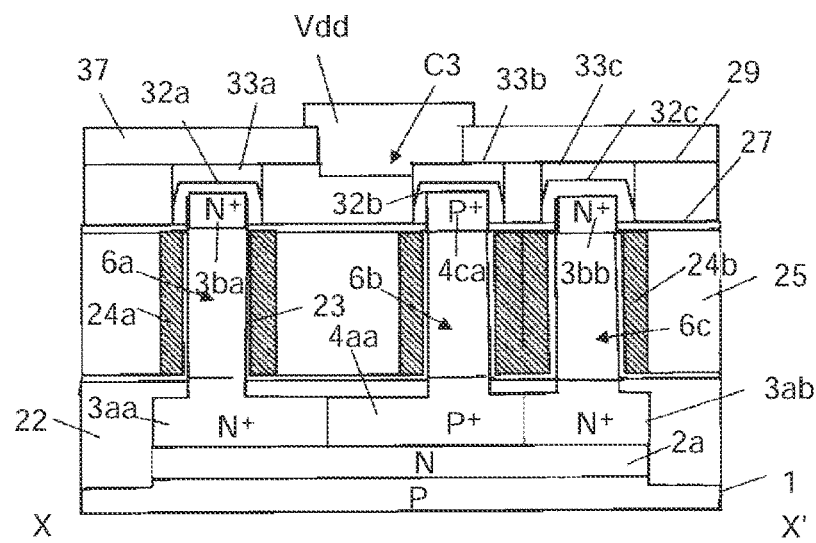
Figure 1S:
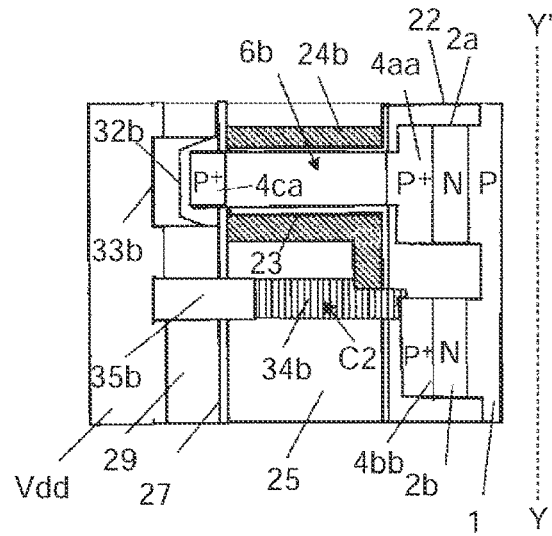

Next, as shown in FIGS. 1SA to 1SC, the band-shaped contact hole C3 is filled and a supply wiring metal layer Vdd (an example of the "first wire conductor layer" according to the scope of claims) to which the W layers 33b and 33e are connected is formed. Note that the supply wiring metal layer Vdd is not limited to a metal layer and may be formed using a single layer or a plurality of layers of a material layer made of an alloy or a semiconductor containing a large amount of donor or acceptor impurities.

Figure 1T:
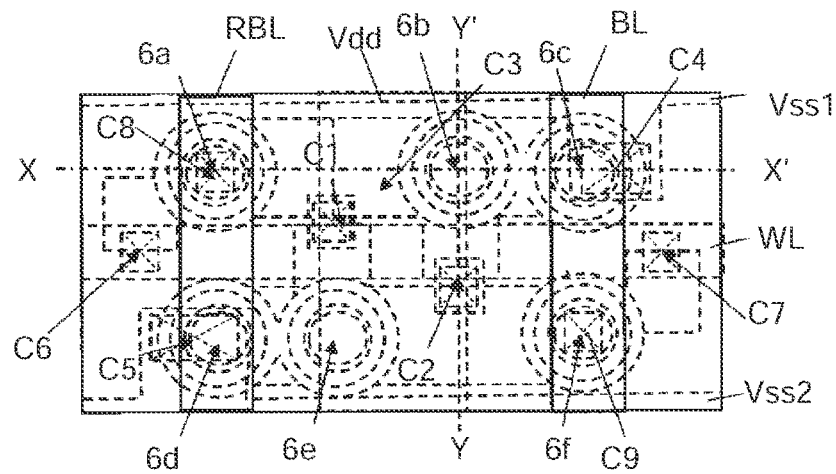
FIGS. 1TA, 1TB and 1TC are a plan view and a sectional structural diagram for explaining the manufacturing method of a pillar-shaped semiconductor device having an SGT according to the first embodiment.
Figure 1T:
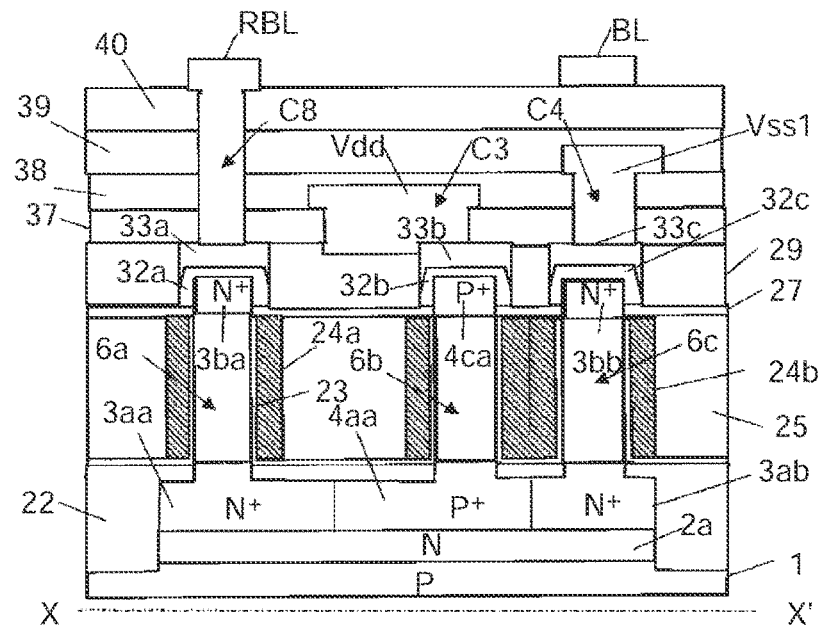
Figure 1T:
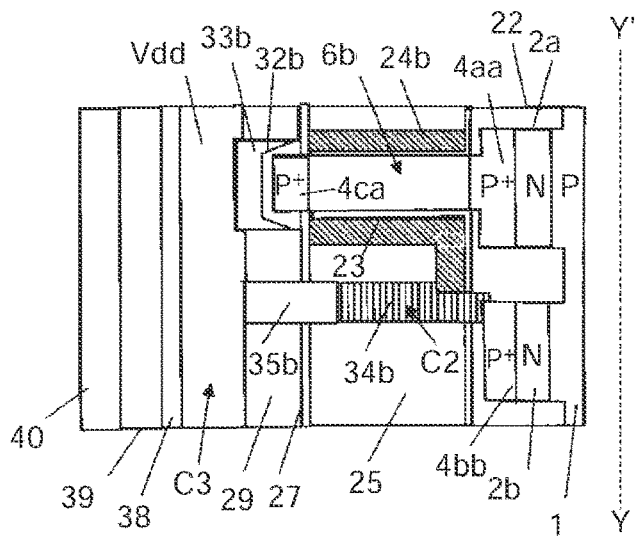

Next, as shown in FIGS. 1TA to 1TC, a $SiO_2$ layer 38 with a flat upper surface is formed so as to cover the entire stack. A ground wiring metal layer Vss1 is formed via a contact hole C4 formed on the W layer 33c on the $N^+$ layer 32c. At the same time, a ground wiring metal layer Vss2 is formed via a contact hole C5 formed on the W layer 33d on the $N^+$ layer 32d. A $SiO_2$ layer 39 with a flat upper surface is formed so as to cover the entire stack. A word wiring metal layer WL is formed via contact holes C6 and C7 formed on the TiN layers 24a and 24d. A $SiO_2$ layer 40 with a flat upper surface is formed so as to cover the entire stack. An inverted bit output wiring metal layer RBL and a bit output wiring metal layer BL are formed via contact holes C8 and C9 formed on the W layers 33a and 33f on the $N^+$ layers 32a and 32f. Accordingly, an SRAM cell circuit is formed on the P layer substrate 1. In the present SRAM circuit, a load SGT is formed on the Si pillars 6b and 6e, a drive SGT is formed on the Si pillars 6c and 6d, and a select SGT is formed on the Si pillars 6a and 6f.

Note that in FIGS. 1NA to 1NC and 10A to 10C, the P+ layers 32b and 32e and the N+ layers 32a, 32c, 32d, and 32f are formed so that upper surfaces thereof are lower than the upper surface of the AlO layer 29. In contrast, the upper surfaces of the P+ layers 32b and 32e and the N+ layers 32a, 32c, 32d, and 32f may be formed higher than the upper surface of the AlO layer 29 as long as the P+ layers 32b and 32e and the N+ layers 32a, 32c, 32d, and 32f do not come into contact with adjacent impurity layers. In addition, in FIGS. 1PA to 1PC, the W layer is polished by a CMP method so that an upper surface position of the W layer equals the upper surface position of the AlO layer 29 to form the W layers 33a, 33b, 33c, 33d, 33e, and 33f. In contrast, the upper surfaces of the W layers 33a, 33b, 33c, 33d, 33e, and 33f may be formed higher than the upper surface of the AlO layer 29 as long as the W layers 33a, 33b, 33c, 33d, 33e, and 33f do not come into contact with adjacent W layers.

In addition, the P layer substrate 1 is used as a substrate in the present embodiment. Alternatively, the N layer 2 on the P layer substrate 1 may also be considered a part of the substrate. In addition, other substrates such as a substrate made of an SOI (Silicon Oxide Insulator) may be used in place of the P layer substrate.

Positions of lower ends of the N+ layers 32a, 32c, 32d, and 32f and the P+ layers 32b and 32e in the vertical direction may be the same as, may be separated from, or may overlap with upper end positions of the gate TiN layers 24a, 24b, 24c, and 24d as long as normal SGT operations can be performed.

In addition, in the state shown in FIGS. 1JA to 1JC, the mask material layers 7a, 7b, 7c, 7d, 7e, and 7f may be absent. In this case, in FIGS. 1KA to 1KC or FIGS. 1LA to 1LC, due to a step of etching the top parts of the Si pillars 6a to 6f, a step of oxidizing the top parts of the Si pillars 6a to 6f and then removing the oxide film, or the like, the upper surface positions of the top parts of the Si pillars 6a to 6f can be made lower than the AlO layer 29.

Note that the following conditions must be met in the formation of the band-shaped contact hole C3 shown in FIGS. 1RA to 1RC.
(Condition 1)

There are no Si pillars (which correspond to 6a, 6c, 6d, and 6f in the present embodiment) other than load SGTs in a region of the band-shaped contact hole C3 in a plan view.
(Condition 2)

The band-shaped contact hole C3 may be formed connected to or separated from an adjacent other SRAM cell in the Y direction in a plan view. However, Si pillars (which correspond to Si pillars 6b and 6e in the present embodiment) which form load SGTs must be connected to each other in both the X direction and the Y direction in a plan view.
(Condition 3)

The band-shaped contact hole C3 is formed in order to connect impurity regions (which correspond to P+ layers 32b and 32e in the present embodiment) to become a source or a drain of an SGT connected to a top part of a Si pillar and a wiring conductive layer made of a metal, an alloy, or the like to each other.

The manufacturing method according to the first embodiment produces the following features.
(Feature 1)

In the present embodiment, the P+ layers 32b and 32e are formed so as to cover P+ layers 4ca and 4da in top parts of the Si pillars 6b and 6e and inside the depressions 30B and 30E formed by self-alignment with the Si pillars 6b and 6e. Accordingly, low-resistance P+ layers 4ca and 32b and P+ layers 4da and 32e are formed at high density. In addition, by increasing depths of the depressions 30B and 30E, resistance values can be readily lowered by eliminating contact with the N+ layers 32c and 32d and the W layers 33c and 33d which are adjacent to the depressions 30B and 30E.
(Feature 2)

The W layers 33b and 33e on the P+ layers 32b and 32e are formed inside the depressions 30B and 30E. Accordingly, the W layers 33b and 33e can be readily separated from similarly-formed N+ layers 32c and 32d and the W layers 33c and 33d which are adjacent to the W layers 33b and 33e.
(Feature 3)

Since the W layers 33b and 33e are in contact with entire upper surfaces of the P+ layers 32b and 32e, the supply wiring metal layer Vdd being a wire conductor layer may be separated from adjacent W layers 33c and 33d and may be connected to partial regions of the W layers 33b and 33e. This indicates that the contact hole C3 for connecting the supply wiring metal layer Vdd being a wire conductor layer and the W layers 33b and 33e to each other can be formed separated from the W layers 33c and 33d. Accordingly, an SRAM cell circuit using a high-density SGT with a low source or drain resistance is formed. The two SGTs formed on the Si pillars 6b and 6c form a CMOS inverter circuit and, in a similar manner, the two SGTs formed on the Si pillars 6d and 6e form a CMOS inverter circuit. This indicates that the present embodiment can be applied to other logic circuits. Accordingly, the present embodiment can contribute toward forming a high-density, high-performance circuit using an SGT.
(Feature 4)

Conventionally, independent contact holes are respectively formed on the Si pillars 6b and 6e on which load SGTs are to be formed. A distance between the two contact holes is shortest as compared to distances between other contact holes of drive SGTs and select SGTs. In this case, when progress is made towards higher integration of SRAM cells, forming the two independent contact holes with one implementation of a lithographic method and an RIE etching method becomes difficult. Therefore, for example, a need arises to implement the lithographic method and the RIE etching method in two divided steps. In this case, in addition to a problem of increased cost that accompanies an increase in the number of steps, a decline in a scale of integration due to incorporating a margin in mask alignment between the two lithographic steps becomes an issue. In addition, a difficultly in production in order to form two independent and fine contact holes that are adjacent to each other becomes an issue. In contrast, in the present embodiment, the band-shaped contact hole C3 is formed so as to overlap with the P+ layers 32b and 32e and the W layers 33b and 33e on the two Si pillars 6b and 6e on which load SGTs are to be formed. Accordingly, the supply wiring metal layer Vdd and the P+ layers 32b and 32e are connected via the band-shaped contact hole C3. In this manner, in the present embodiment, independent contact holes are not formed on the Si pillars 6b and 6e. Accordingly, cost reduction due to the contact hole being formed by one implementation of a lithographic method and an RIE etching method can be achieved and, at the same time, a decline in a scale of integration can be prevented due to an absence of an issue of a margin of mask alignment. Since the band-shaped contact hole C3 can be formed wider as compared to a conventional method of forming two independent contact holes, there is an advantage that pattern accuracy can be improved. As a result, according to the present embodiment, an SRAM cell circuit using a high-integration and high-performance SGT is formed at low cost. In a similar manner, a logic circuit using a high-integration and high-performance SGT is formed.

Second Embodiment

Figure 2A:
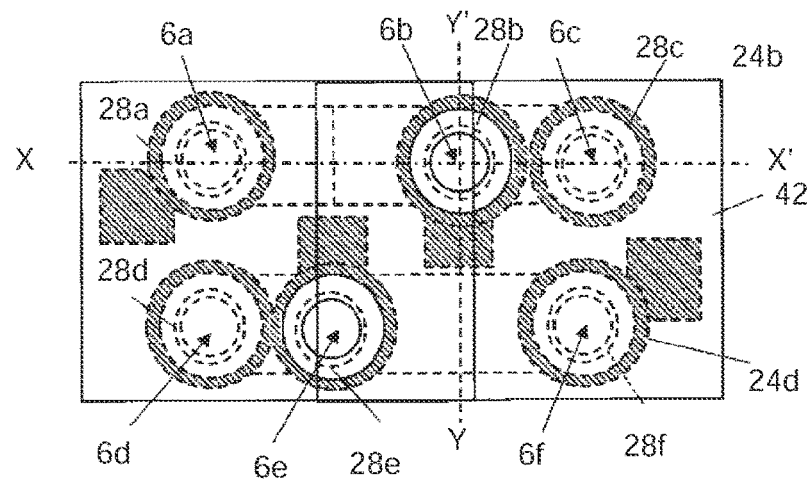
FIGS. 2AA, 2AB and 2AC are a plan view and a sectional structural diagram for explaining a manufacturing method of a pillar-shaped semiconductor device having an SGT according to a second embodiment of the present invention.
Figure 2A:
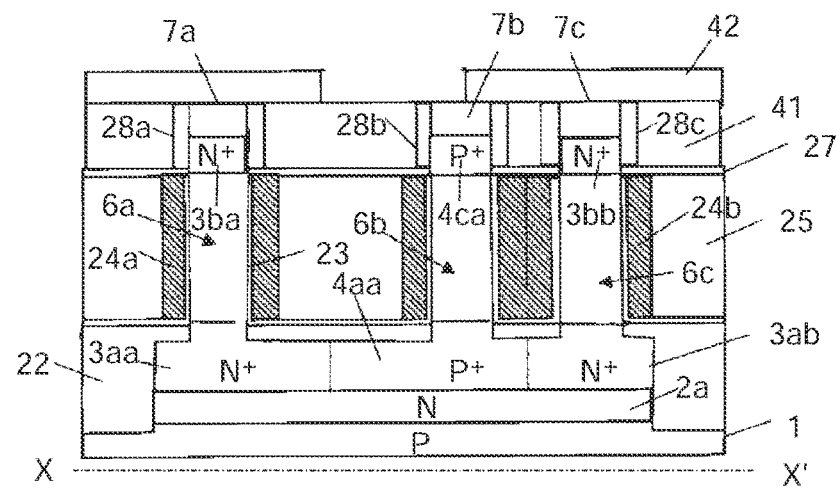
Figure 2A:
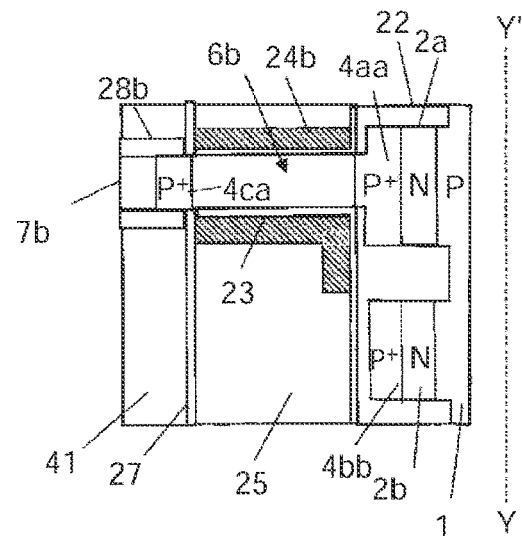

Hereinafter, a manufacturing method of an SRAM cell circuit having an SGT according to a second embodiment of the present invention will be described with reference to FIGS. 2AA to 2CC. In each diagram, A represents a plan view, B represents a sectional structural diagram taken along an X-X' line in A, and C represents a sectional structural diagram taken along a Y-Y' line in A.

In the present embodiment, first, steps shown in FIGS. 1AA to FIG. 1QC described in the first embodiment are performed. The entire stack is coated by a resist layer (not illustrated). Using a lithographic method, a resist layer 42 (an example of the "first mask material layer" according to the scope of claims) which overlaps with the Si pillars 6b and 6e in a plan view and which has a band-shaped cavity is formed on a SiN layer 41, the mask material layers 7a to 7f, and the SiO$_2$ layers 28a to 28f as shown in FIG. 2A.

Figure 2B:
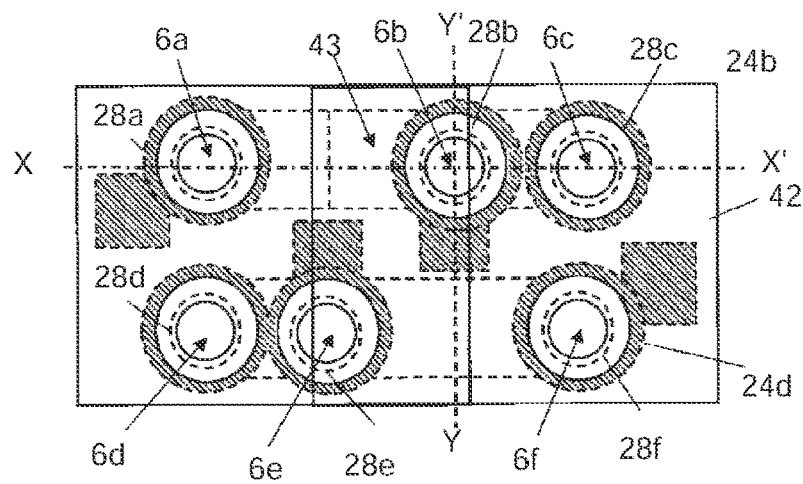
FIGS. 2BA, 2BB and 2BC are a plan view and a sectional structural diagram for explaining the manufacturing method of a pillar-shaped semiconductor device having an SGT according to the second embodiment of the present invention.
Figure 2B:
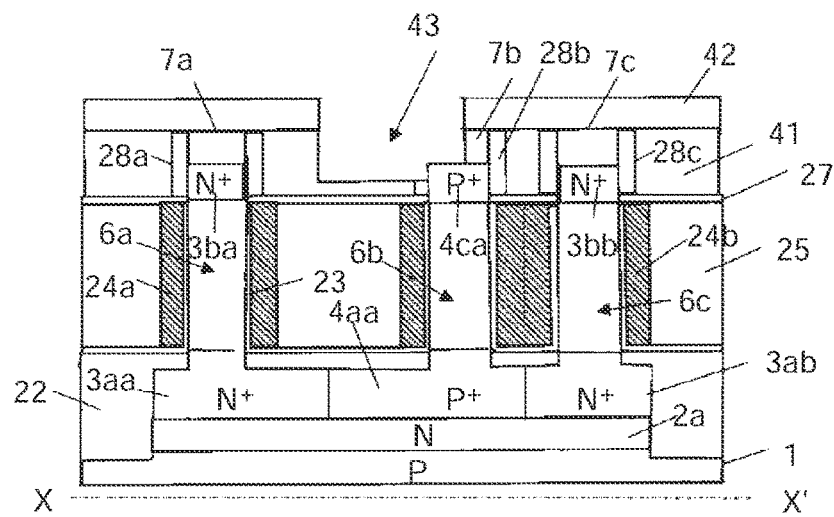
Figure 2B:
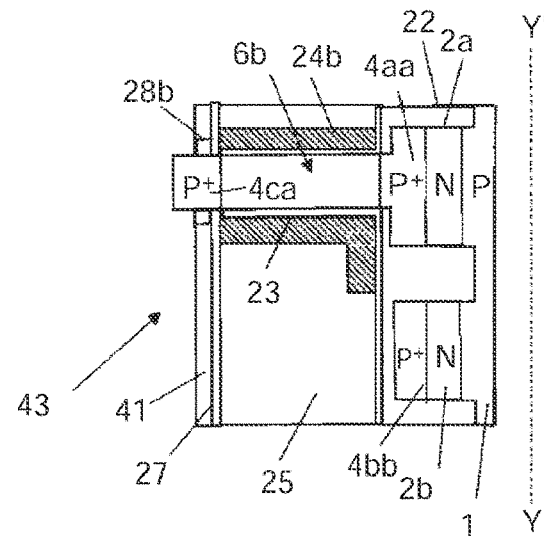

Next, as shown in FIGS. 2BA to 2BC, using the resist layer 42 as a mask, the SiN layer 41, the mask material layers 7b and 7e, and the SiO$_2$ layers 28b and 28e are etched by an RIE method so that upper surface positions thereof are lower than upper surface positions of the top parts of the Si pillars 6b and 6e to form a depression 43. Note that a bottom part of the depression 43 may reach the SiN layer 27. As the resist layer 42, other material layers made of a single layer or made up of a plurality of layers may be used as long as the material layers serve the purpose of an etching mask.

Figure 2C:
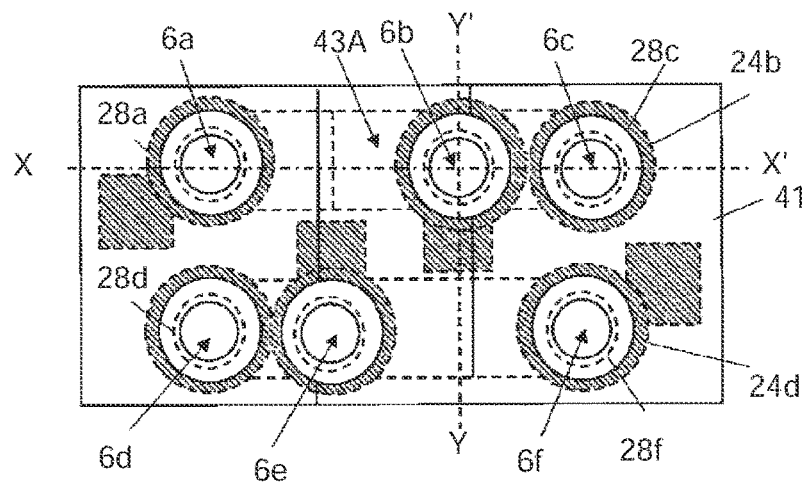
FIGS. 2CA, 2CB and 2CC are a plan view and a sectional structural diagram for explaining the manufacturing method of a pillar-shaped semiconductor device having an SGT according to the second embodiment of the present invention.
Figure 2C:
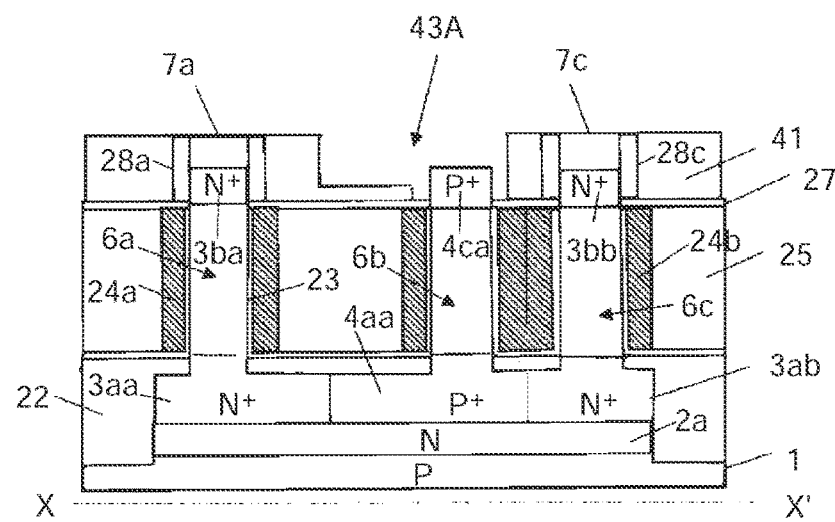
Figure 2C:
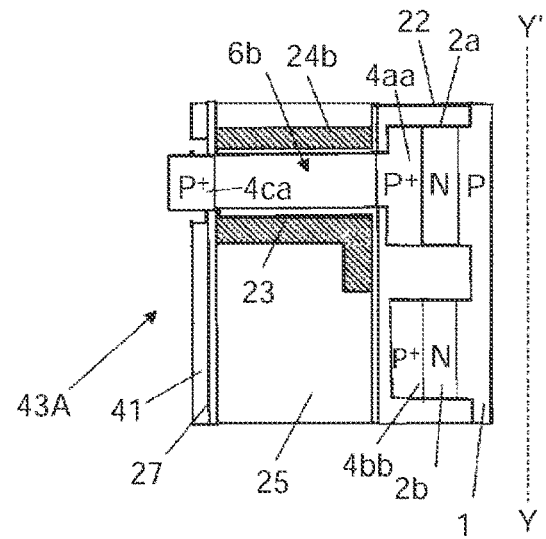

Next, the resist layer 42 is removed. As shown in FIGS. 2CA to 2CC, the mask material layers 7b and 7e and the SiO$_2$ layers 28b and 28e on the Si pillars 6b and 6e are removed to form a depression 43A (an example of the "third depression" according to the scope of claims). The depression 43A is made up of a rectangular part which extends in the Y direction and a removed portion of the SiO$_2$ layers 28b and 28e which surround the top parts of the Si pillars 6b and 6e.

Figure 2D:
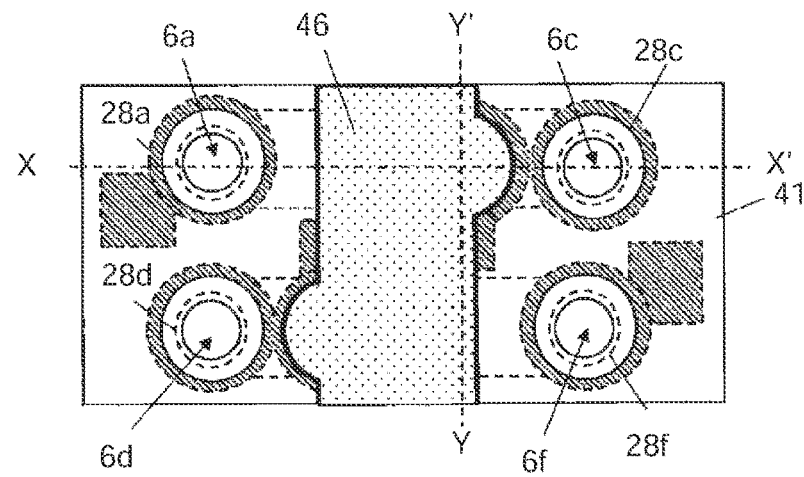
FIGS. 2DA, 2DB and 2DC are a plan view and a sectional structural diagram for explaining the manufacturing method of a pillar-shaped semiconductor device having an SGT according to the second embodiment of the present invention.
Figure 2D:
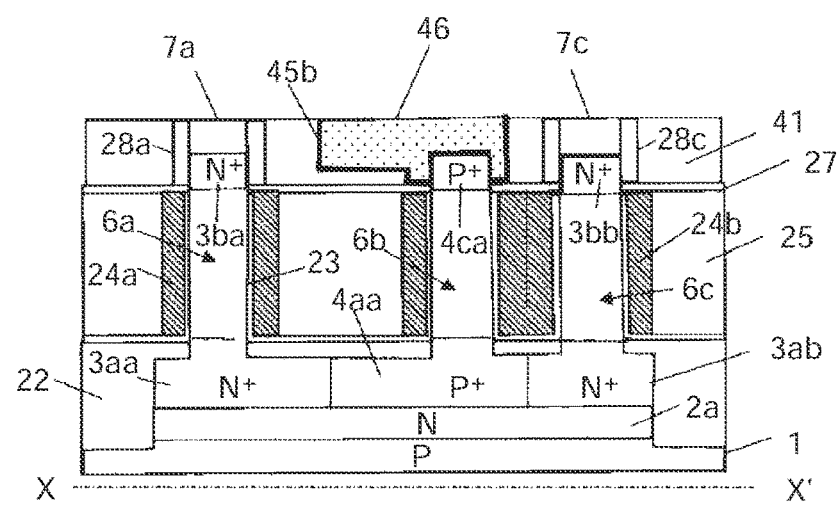
Figure 2D:
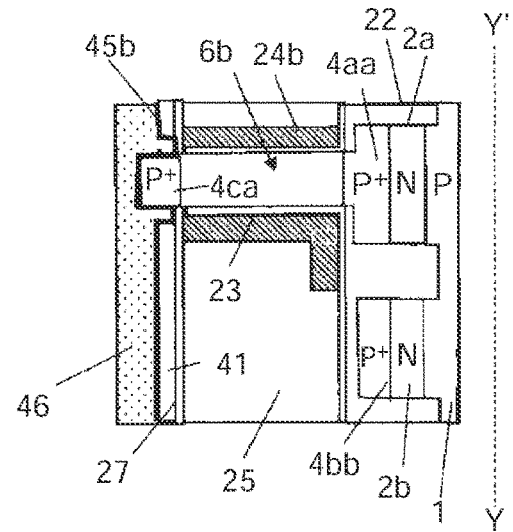

Next, the entire stack is coated by a thin single-crystal Si layer (not illustrated) by an ALD method and a P$^+$ layer (not illustrated) containing acceptor impurities by an epitaxial crystal growth method. The P$^+$ layer and the thin Si layer are polished so that upper surface positions thereof equal an upper surface position of the SiN layer 41 to form a thin single crystal Si layer 45b (an example of the "single crystal semiconductor thin film layer" according to the scope of claims) and a P$^+$ layer 46 as shown in FIGS. 2DA to 2DC.

Figure 2E:
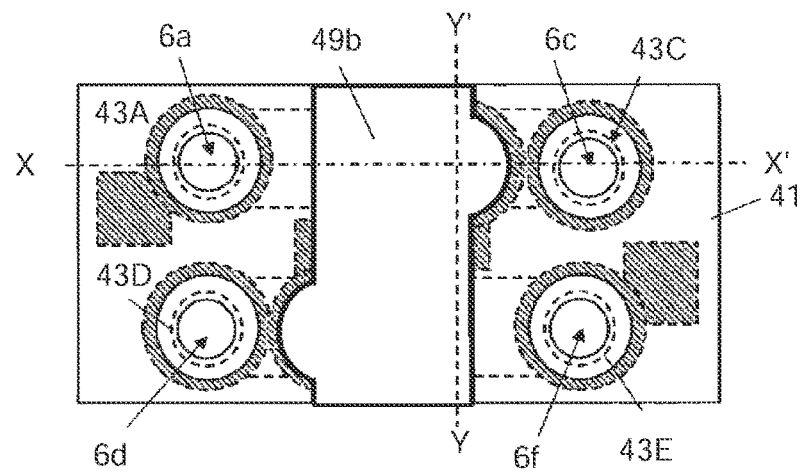
FIGS. 2EA, 2EB and 2EC are a plan view and a sectional structural diagram for explaining the manufacturing method of a pillar-shaped semiconductor device having an SGT according to the second embodiment of the present invention.
Figure 2E:
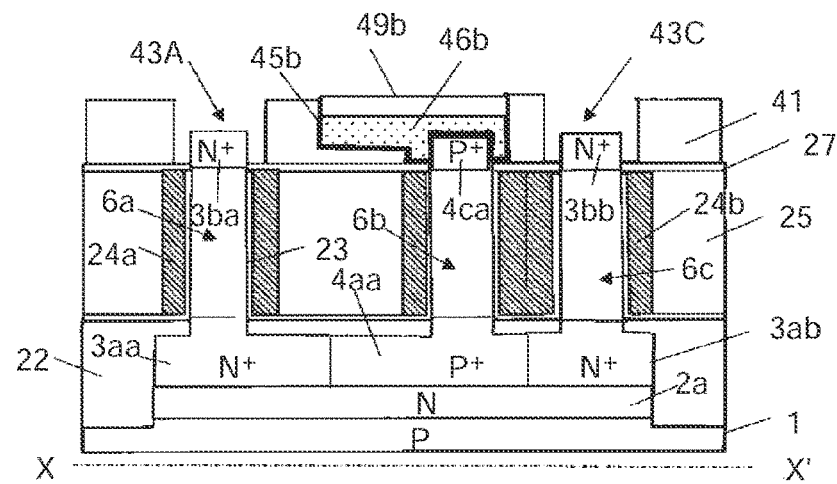
Figure 2E:
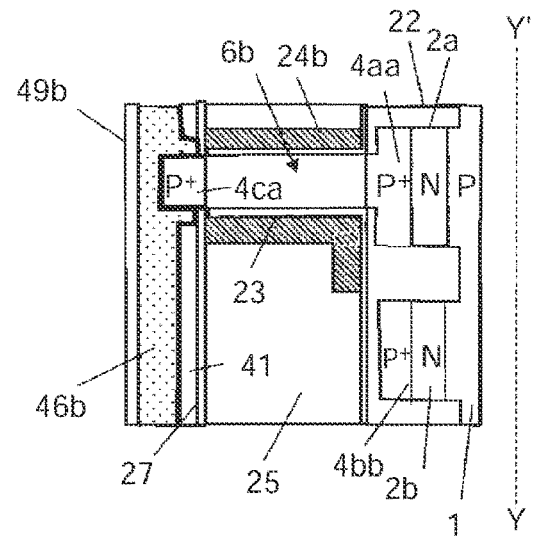

Next, as shown in FIGS. 2EA to 2EC, upper parts of the thin Si layer 45b and the P$^+$ layer 46 are etched to form a P$^+$ layer 46b. A mask material layer 49b which is in an upper part of the P$^+$ layer 46b and of which an upper surface position is equal to the upper surface position of the SiN layer 41 is formed using a CVD method and a CMP method. The mask material layers 7a, 7c, 7d, and 7f and the SiO$_2$ layers 28a, 28c, 28d, and 28f in outer circumferential parts of the top parts and on the top parts of the Si pillars 6a, 6c, 6d, and 6f are removed to form depressions 43A, 43C, 43D, and 43E on the top parts of the Si pillars 6a, 6c, 6d, and 6f. Note that the P$^+$ layer 46b is made of an impurity layer connected to the P$^+$ layer 32b shown in FIGS. 1NA to 1NC in the first embodiment. Alternatively, the P$^+$ layer 46b may be formed by a selective epitaxial crystal growth method as in the first embodiment. Alternatively, a single-crystal P$^+$ layer 46b may be formed using other methods such as a molecular beam crystal growth method.

Figure 2F:
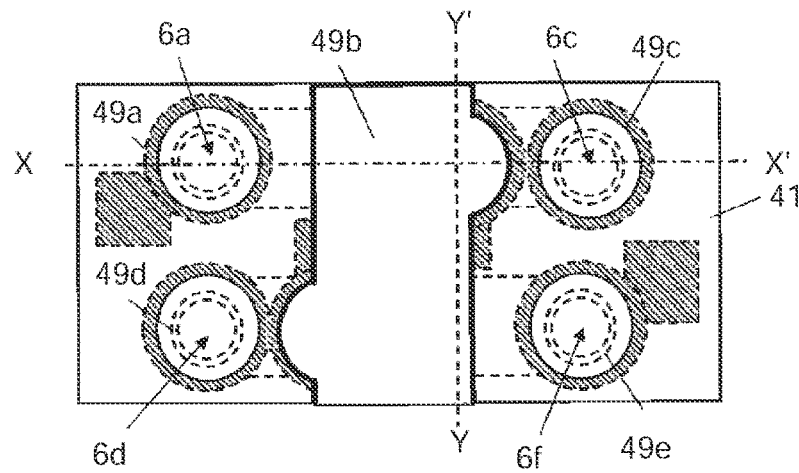
FIGS. 2FA, 2FB and 2FC are a plan view and a sectional structural diagram for explaining the manufacturing method of a pillar-shaped semiconductor device having an SGT according to the second embodiment of the present invention.
Figure 2F:
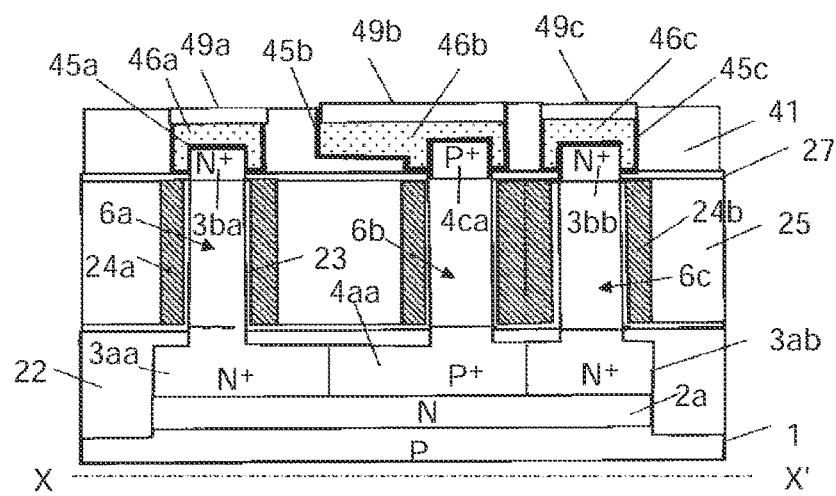
Figure 2F:
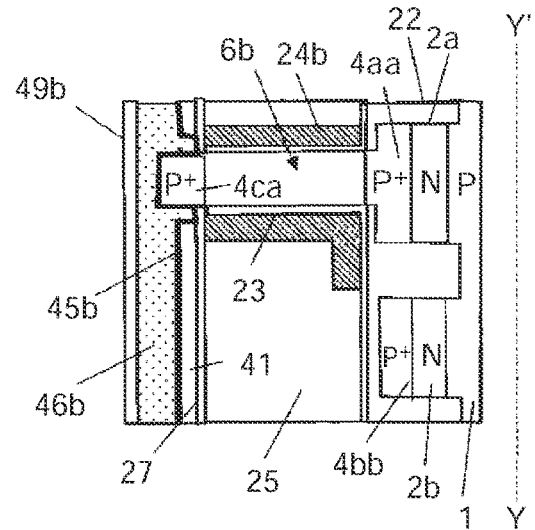

Next, as shown in FIGS. 2FA to 2FC, using a same method as the method used to form the P$^+$ layer 46b, thin single crystal Si layers 45a, 45c, 45d (not illustrated), and 45e (not illustrated) and N$^+$ layers 46a, 46c, 46d (not illustrated), and 46e (not illustrated) which contains donor impurities are formed inside the depressions 43A, 43C, 43D, and 43E. Mask material layers 49a, 49c, 49d, and 49e of which upper surface positions are equal to the upper surface position of the SiN layer 41 are formed on the N$^+$ layers 46a, 46c, 46d, and 46e.

Figure 2G:
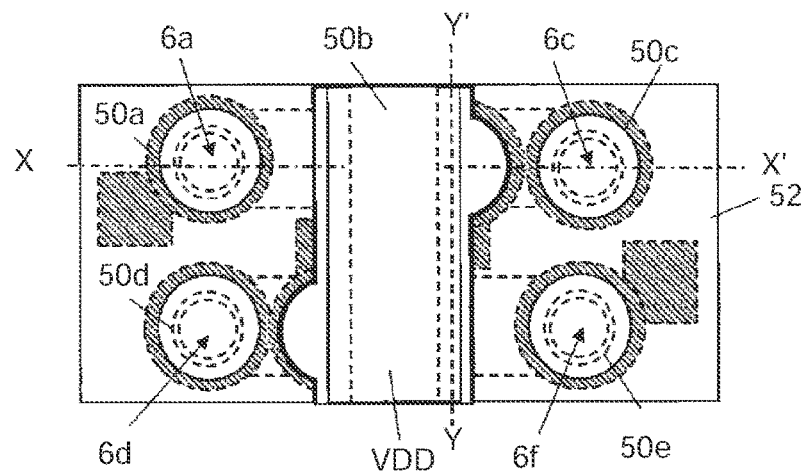
FIGS. 2GA, 2GB and 2GC are a plan view and a sectional structural diagram for explaining the manufacturing method of a pillar-shaped semiconductor device having an SGT according to the second embodiment of the present invention.
Figure 2G:
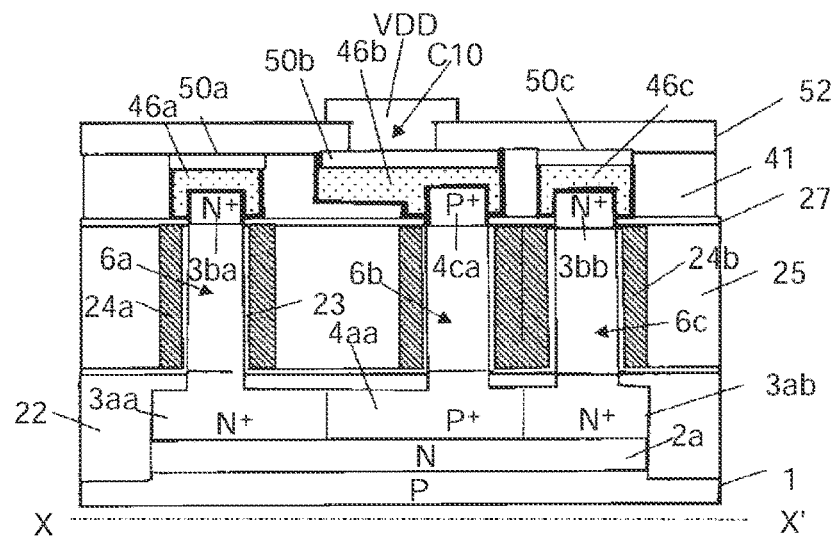
Figure 2G:
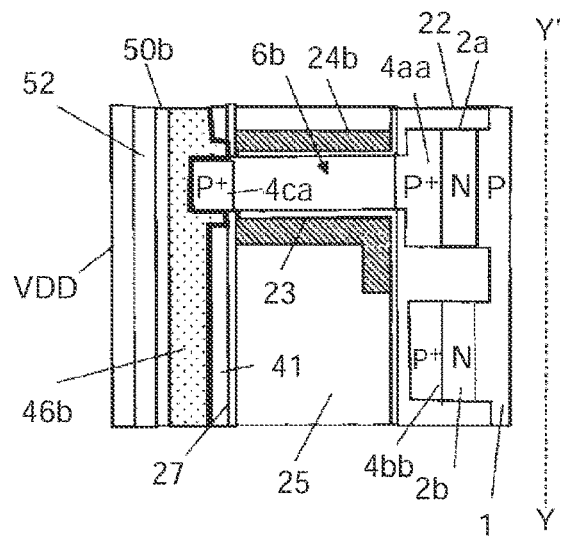

Next, the mask material layers 49a, 49b, 49c, 49d, and 49e are removed. As shown in FIGS. 2GA to 2GC, W layers 50a, 50b (an example of the "third conductor layer" according to the scope of claims), 50c, and 50e are formed on the N$^+$ layers 46a, 46c, 46d, and 46e and the P$^+$ layer 46b using a CVD method and a CMP method. A SiO$_2$ layer 52 is formed on the entire stack. The SiO$_2$ layer 52 on the W layer 50b is removed and a band-shaped contact hole C10 is formed using a lithographic method and an RIE etching method. A supply wiring metal layer VDD connected to the W layer 50b via the band-shaped contact hole C10 is formed. By performing the step shown in FIGS. 1TA to 1TC, an SRAM cell circuit is formed on the P layer substrate 1. Note that the W layers 50a, 50b, 50c, and 50e may be formed of a conductor layer made of a single layer or a plurality of layers of another metal or an alloy.

Since the thin single crystal Si layers 45a to 45e are layers for forming the P$^+$ layer 46b and the N$^+$ layers 46a, 46c, 46d, and 46f with good crystallinity, other single crystal semiconductor thin film layers may be used as long as a same purpose can be served.

Note that an impurity layer containing donor impurity atoms may be formed in top parts of the Si pillars 6a, 6c, 6d, and 6f and an impurity layer containing acceptor impurity atoms may be formed in the top parts of the Si pillars 6b and 6e under the thin single crystal Si layers 45a to 45e. The impurity layers may be formed by thermal diffusion of acceptor impurity atoms and donor impurity atoms from the P$^+$ layer 46b and the N$^+$ layers 46a, 46c, and 46e after the formation of the thin single crystal Si layers 45a to 45e. Alternatively, the impurity layers may be formed by forming the P$^+$ layer 46b and the N$^+$ layers 46a, 46c, and 46e by impregnating the top parts of the Si pillars 6a to 6f with acceptor impurity atoms and donor impurity atoms prior to the formation of the thin single crystal Si layers 45a to 45e.

The manufacturing method according to the second embodiment produces the following features.

(Feature 1)

In the first embodiment, the P$^+$ layers 32b and 32e are formed by a selective epitaxial crystal growth method in the depressions 30B and 30E in an outer circumferential part of top parts of the Si pillars 6b and 6e. The P$^+$ layers 32b and 32e in contact with the top parts of the Si pillars 6b and 6e are required to have good crystallinity. When the crystallinity is poor, problems such as the P$^+$ layers 32b and 32e causing an increase in diode resistance, an increase in leakage current, or a decline in junction breakdown voltage arise. In order to improve the crystallinity, areas of the depressions 32B and 32E of which crystals are to be grown are desirably widened in a plan view. However, since the areas of the depressions 32B and 32E decrease due to densification of the SRAM cell, it is difficult to form P$^+$ layers 32b and 32e with good crystallinity. In contrast, in the present embodiment, since the area of the depression 43A to be formed by epitaxial crystal growth is larger than the depressions 32B and 32E according to the first embodiment, the P$^+$ layer 46 with good crystallinity can be formed. Accordingly, reductions in diode resistance and leakage current and an increase in breakdown voltage can be achieved. Furthermore, by forming the P$^+$ layer 46 by epitaxial crystal growth after forming the single crystal thin-film Si layer 45, the P$^+$ layer 46 with even better crystallinity can be formed.

(Feature 2)

In the present embodiment, the P$^+$ layer 46b and the N$^+$ layers 46a, 46c, 46d, and 46e include impurity regions which, by self-alignment, concentrically surround the top parts of the Si pillars 6a to 6f. Accordingly, a distance between the adjacent Si pillars 6b and 6c and a distance between the adjacent Si pillars 6d and 6e can be reduced. As a result, densification of the SRAM cell can be achieved. In a similar manner, the W layers 50a to 50e on the P$^+$ layer 46b and the N$^+$ layers 46a, 46c, 46d, and 46e are formed inside the depressions 43A to 43E having been formed by self-alignment. Accordingly, the contact hole C10 for connecting the top of the W layer 50b and the supply wiring metal layer VDD with each other can be separated from the W layers 50a, 50c, 50d, and 50e on the adjacent Si pillars 6a, 6c, 6d, and 6f. As a result, densification of the SRAM cell can be achieved.

Third Embodiment

Hereinafter, a manufacturing method of an SRAM cell circuit having an SGT according to a third embodiment of the present invention will be described with reference to FIGS. 3AA to 3CC. In each diagram, A represents a plan view, B represents a sectional structural diagram taken along an X-X' line in A, and C represents a sectional structural diagram taken along a Y-Y' line in A.

Figure 3A:
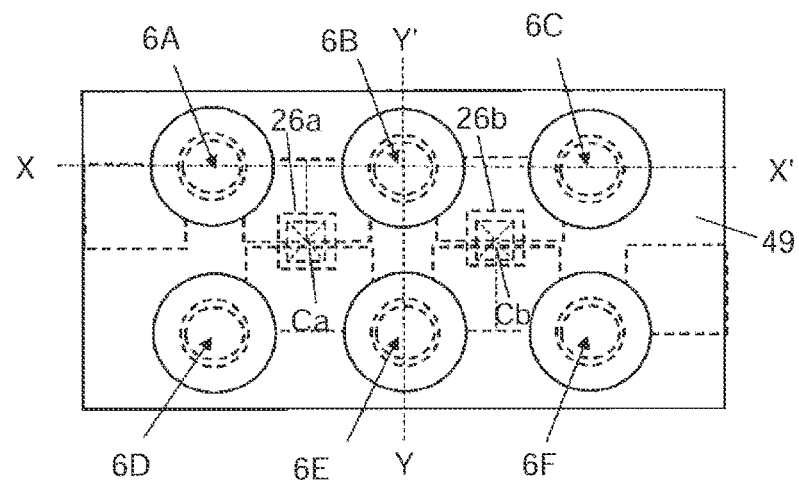
FIGS. 3AA, 3AB and 3AC are a plan view and a sectional structural diagram for explaining a manufacturing method of a pillar-shaped semiconductor device having an SGT according to a third embodiment of the present invention.
Figure 3A:
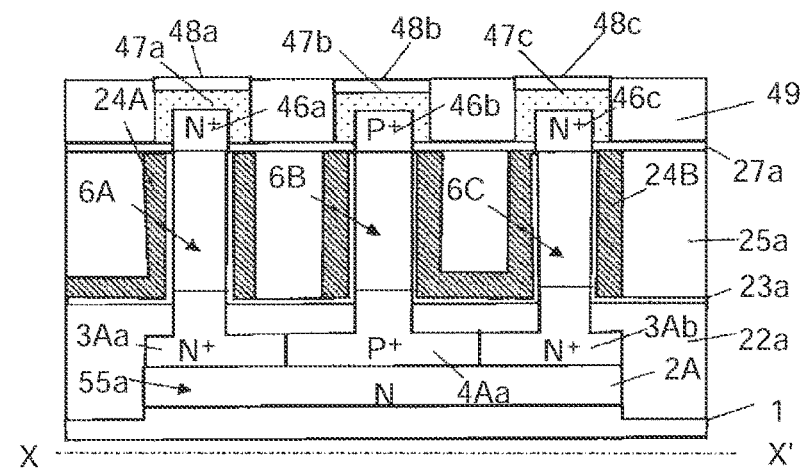
Figure 3A:
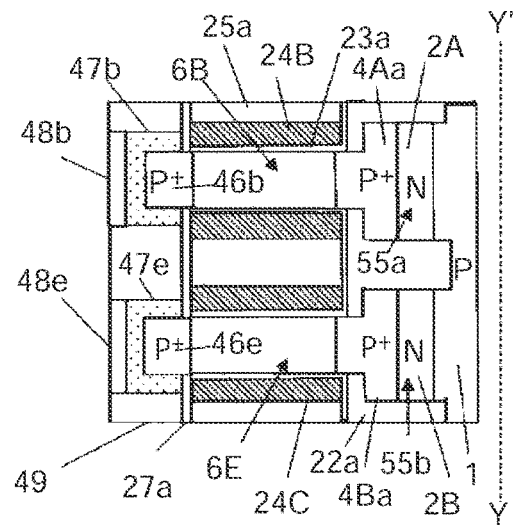

As shown in FIGS. 3AA to 3AC, a Si pedestal 55a made up of the N layer 2A, the N$^+$ layers 3Aa and 3Ab, and the P$^+$ layer 4Aa and a Si pedestal 55b made up of the N layer 2B, the N$^+$ layers 3Ba (not illustrated) and 3Bb (not illustrated), and the P$^+$ layer 4Ba are formed on the P layer substrate 1. Si pillars 6A, 6B, 6C, 6D, 6E, and 6F are formed on the Si pedestals 55a and 55b. A straight line connecting centers of the Si pillars 6B and 6E is along the Y direction. In a similar manner, a straight line connecting centers of the Si pillars 6A and 6D and a straight line connecting centers of the Si pillars 6C and 6F are also along the Y direction. A SiO$_2$ layer 22a is formed in outer circumferential parts of bottom parts of the Si pillars 6A to 6F. A gate HfO$_2$ layer 23a is formed by an ALD method so as to cover the entire stack. A gate TiN layer 24A is formed so as to surround the HfO$_2$ layer 23a which surrounds the Si pillar 6A. At the same time, a gate TiN layer 24B is formed so as to surround the HfO$_2$ layer 23a which surrounds the Si pillars 6B and 6C. At the same time, a gate TiN layer 24C is formed so as to surround the HfO$_2$ layer 23a which surrounds the Si pillars 6D and 6E. At the same time, a gate TiN layer 24D (not illustrated) is formed so as to surround the HfO$_2$ layer 23a which surrounds the Si pillar 6F. A SiO$_2$ layer 25a is formed so as to surround the gate TiN layers 24A, 24B, 24C, and 24D.

As shown in FIGS. 3AA to 3AC, a W layer 26a which connects to the TiN layer 24C, the N$^+$ layer 3Aa, and the P$^+$ layer 4Aa via a contact hole Ca formed in the SiO$_2$ layer 25a and of which an upper surface position is lower than upper surface positions of the TiN layers 24A to 24D is formed. At the same time, a W layer 26b which connects to the TiN layer 24B, the N$^+$ layer 3Bb, and the P$^+$ layer 4Ba via a contact hole Cb formed in the SiO$_2$ layer 25a and of which an upper surface position is lower than the upper surface positions of the TiN layers 24A to 24D is formed. A SiN layer 27a is formed in an outer circumferential part of top parts of the Si pillars 6A to 6F and on top of upper ends of the gate TiN layers 24A to 24D. N$^+$ layers 46a, 46c, 46d (not illustrated), and 46f (not illustrated) are formed in top parts of the Si pillars 6A, 6C, 6D, and 6F and P$^+$ layers 46b and 46e are formed in top parts of the Si pillars 6B and 6E. In addition, by the same steps as those shown in FIGS. 1KA to 1PC according to the first embodiment, N$^+$ layers 47a, 47c, 47d (not illustrated), and 47f (not illustrated) and P$^+$ layers 47b and 47e are formed by a selective epitaxial crystal growth method, and W layers 48a, 48b, 48c, 48d (not illustrated), 48e and 48f (not illustrated) are formed on the N$^+$ layers 47a, 47c, 47d, and 47f and the P$^+$ layers 47b and 47e. A SiO$_2$ layer 49 is formed in outer circumferential parts of the N$^+$ layers 47a, 47c, 47d, and 47f, the P$^+$ layers 47b and 47e, and the W layers 48a, 48b, 48c, 48d, 48e, and 48f.

Figure 3B:
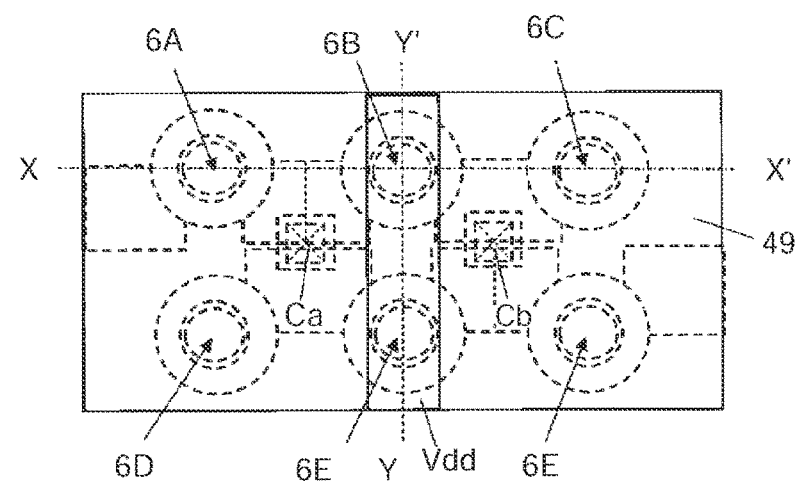
FIGS. 3BA, 3BB and 3BC are a plan view and a sectional structural diagram for explaining the manufacturing method of a pillar-shaped semiconductor device having an SGT according to the third embodiment of the present invention.
Figure 3B:
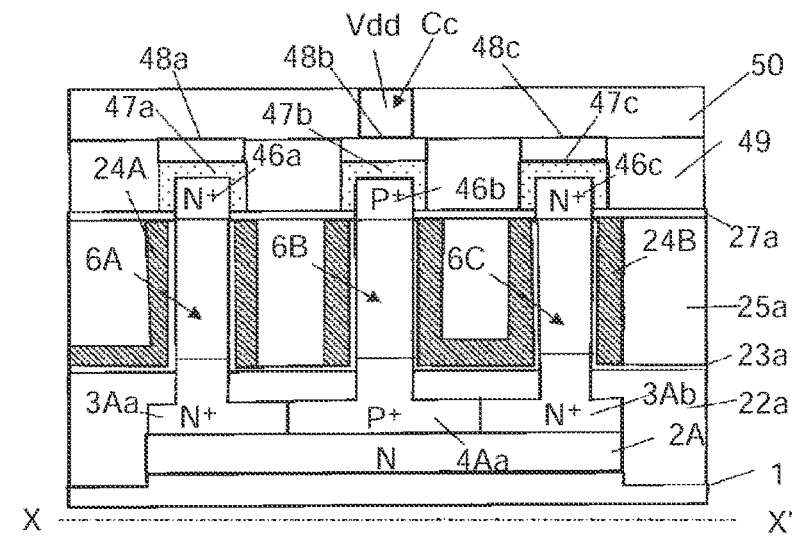
Figure 3B:
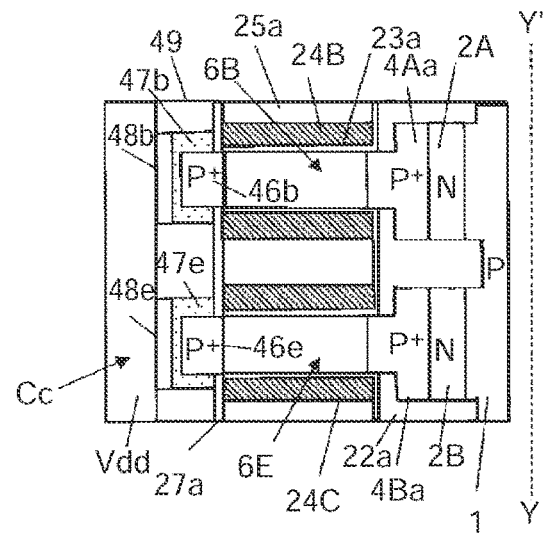

Next, as shown in FIGS. 3BA to 3BC, a SiO$_2$ layer 50 is formed on the W layers 48a, 48b, 48c, 48d, 48e, and 48f and the SiO$_2$ layer 49. A band-shaped contact hole Cc of which a bottom part position is equal to upper surface positions of the P$^+$ layers 47b and 47e, which overlaps with the W layers 48b and 48e in a plan view, and which extends in the Y direction is formed by a lithographic method and RIE etching. The band-shaped contact hole Cc is on the inner side of the W layer 48b on an X-X' line in a plan view. The band-shaped contact hole Cc and the W layer 48e are in a same relationship. The contact hole Cc is filled to form a supply wiring metal layer Vdd which is connected to the P$^+$ layers 47b and 47e. In this case, upper surface positions of the SiO$_2$ layer 50 and the supply wiring metal layer Vdd are made the same by CMP. Accordingly, the supply wiring metal layer Vdd is prevented from protruding more outward than the band-shaped contact hole Cc in a plan view.

Figure 3C:
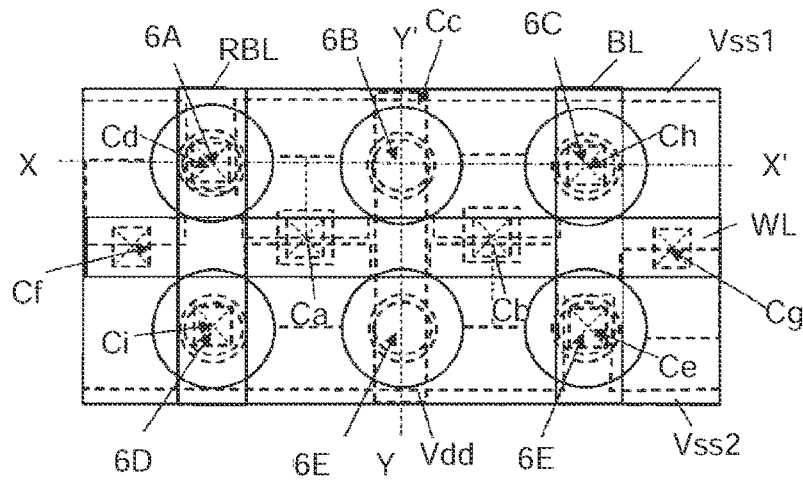
FIGS. 3CA, 3CB and 3CC are a plan view and a sectional structural diagram for explaining the manufacturing method of a pillar-shaped semiconductor device having an SGT according to the third embodiment of the present invention.
Figure 3C:
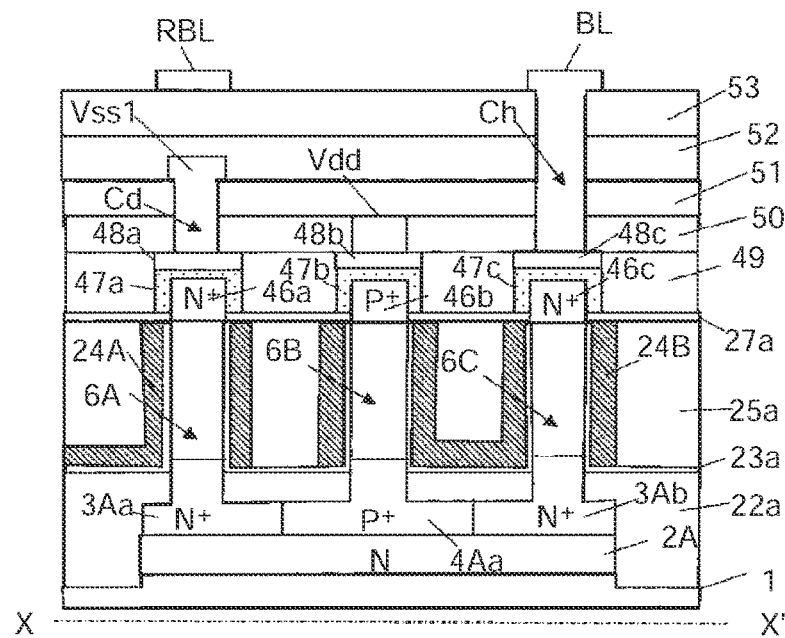
Figure 3C:
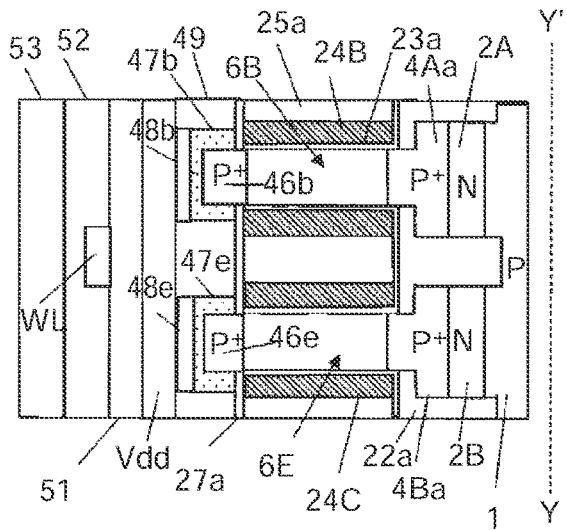

Next, as shown in FIGS. 3CA to 3CC, a SiO$_2$ layer 51 with a flat upper surface is formed so as to cover the entire stack. A ground wiring metal layer Vss1 is formed via a contact hole Cd formed on the W layer 48a. At the same time, a ground wiring metal layer Vss2 is formed via a contact hole Ce formed on the W layer 48f. The SiO$_2$ layer 52 with a flat upper surface is formed so as to cover the entire stack. A word wiring metal layer WL is formed via contact holes Cf and Cg formed on the TiN layers 24A and 24D. A SiO$_2$ layer 53 with a flat upper surface is formed so as to cover the entire stack. A bit output wiring metal layer BL and an inverted bit output wiring metal layer RBL are formed via contact holes Ch and Ci formed on the W layers 48c and 48d. Accordingly, an SRAM cell circuit is formed on the P layer substrate 1.

The manufacturing method according to the third embodiment produces the following features.

(Feature 1)

In the first embodiment, the Si pillars 6b and 6e are formed displaced in the X direction. In contrast, in the present embodiment, centers of the Si pillars 6B and 6E are on a single line that extends in the Y direction. Although an arrangement of the Si pillars 6A to 6F in the SRAM cell in the present embodiment differs from the arrangement of the Si pillars 6a to 6f in the first embodiment, the present embodiment has the same features as the first embodiment. The P$^+$ layers 47b and 47e and the W layers 48b and 48e are formed by self-alignment with the Si pillars 6B and 6E. Accordingly, the P$^+$ layers 47b and 47e and the W layers 48b and 48e can reliably separate the N⁺ layers 47c and 47d and the W layers 48c and 48d formed in top parts of the adjacent Si pillars 6C and 6D. At the same time, since the P⁺ layers 47b and 47e cover the P⁺ layers 46b and 46e, a low-resistance source region or a low-resistance drain region is formed.

(Feature 2)

In the present embodiment, the band-shaped contact hole Cc is on the inner side of the W layer 48b on the X-X' line. The band-shaped contact hole Cc and the W layer 48e are in a same relationship. In addition, since the band-shaped contact hole Cc need only be connected to a part of the W layers 48b and 48e in a plan view, a decline in yield due to a displacement in mask alignment can be prevented. Furthermore, since the band-shaped contact hole Cc can be formed wider as compared to forming two independent contact holes on the W layers 48b and 48e, there is an advantage that pattern accuracy can be improved. Accordingly, an SRAM cell using a high-integration and high-accuracy SGT is formed at low cost.

Fourth Embodiment

Figure 4A:
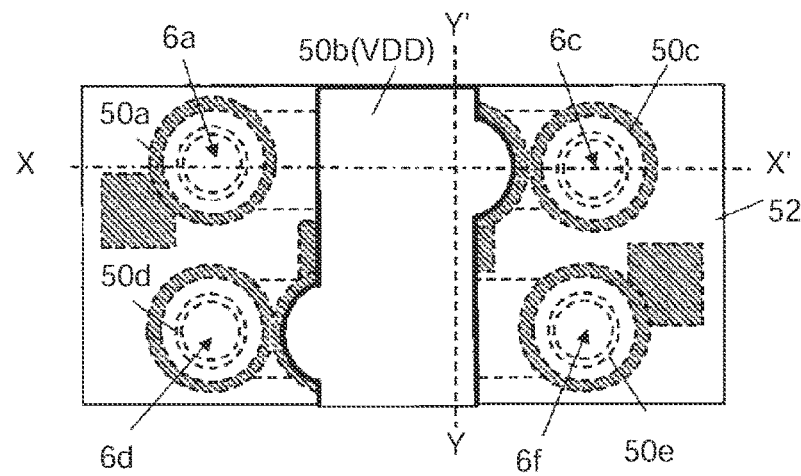
FIGS. 4A, 4B and 4C are a plan view and a sectional structural diagram for explaining a manufacturing method of a pillar-shaped semiconductor device having an SGT according to a fourth embodiment of the present invention.
Figure 4B:
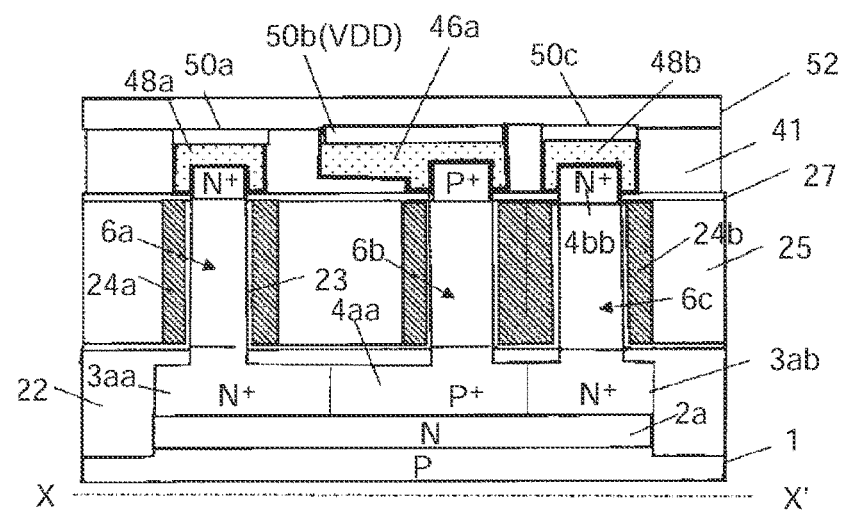
Figure 4C:
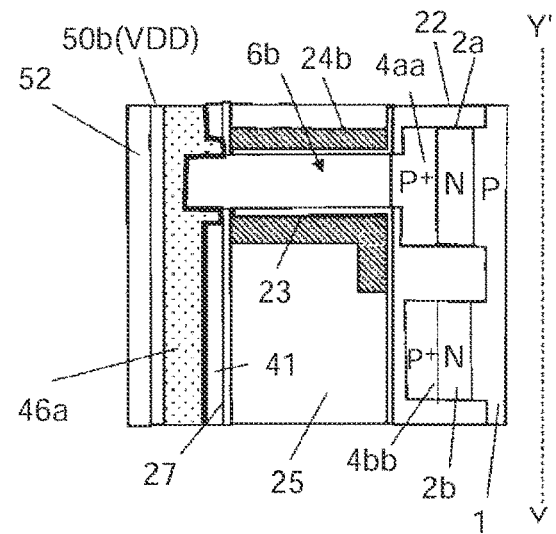
Figure 5A:
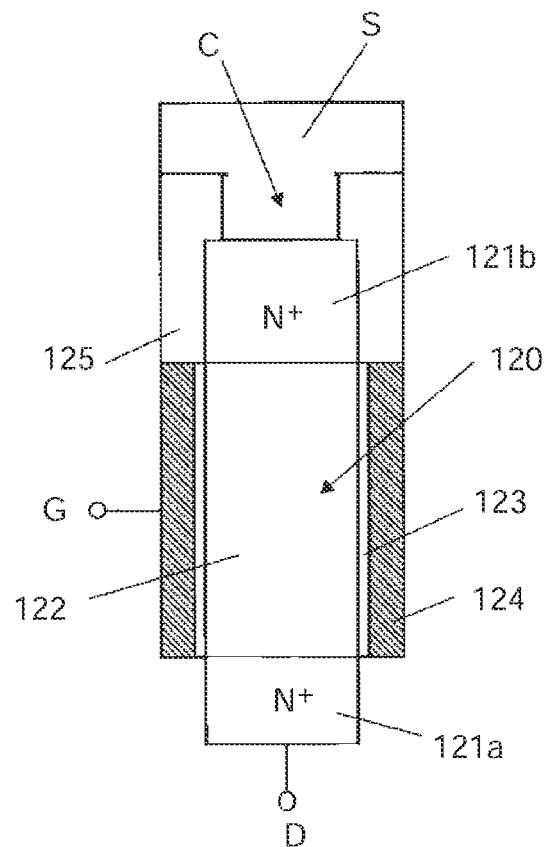
FIGS. 5A and 5B are schematic structural diagrams showing an SGT according to a conventional example.
Figure 5B:
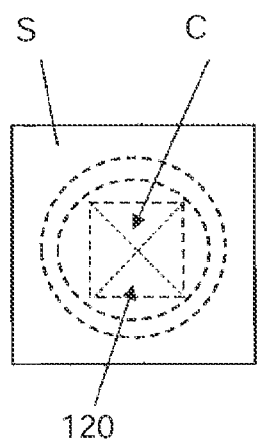
Figure 6:
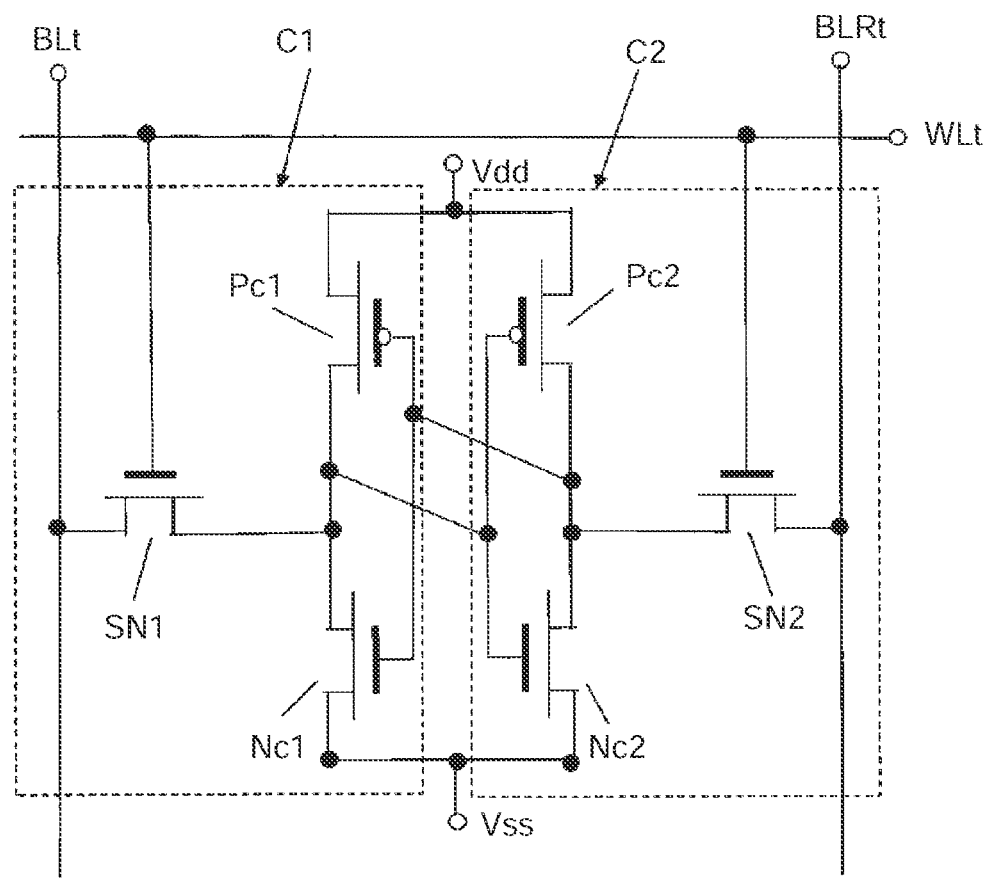
FIG. 6 is an SRAM cell circuit diagram using an SGT according to a conventional example.

Hereinafter, a manufacturing method of an SRAM cell circuit having an SGT according to a fourth embodiment of the present invention will be described with reference to FIGS. 4A to 4C. In FIGS. 4A to 4C, A represents a plan view, B represents a sectional structural diagram taken along an X-X' line in A, and C represents a sectional structural diagram taken along a Y-Y' line in A.

As shown in FIGS. 4A to 4C, the contact hole C10 and the supply wiring metal layer VDD shown in FIGS. 2GA to 2GC are not formed. The W layer 50b acts as the supply wiring metal layer VDD. The W layer 50b is connected to a wiring metal layer which corresponds to the supply wiring metal layer VDD shown in FIGS. 1TA to 1TC on the outside of the SRAM cell region.

The manufacturing method according to the fourth embodiment produces the following features.

In the present embodiment, since the W layer 50b acts as the supply wiring metal layer VDD, the formation step of the contact hole C10 and the supply wiring metal layer VDD in the SRAM cell region shown in FIGS. 2GA to 2GC in the second embodiment is not necessary. Accordingly, a decline in the scale of integration and a decline in yield which accompany formation of a contact hole and a wiring metal layer in the SRAM cell can be prevented. In addition, when the present invention is applied to a logic circuit, since a distance from a unit circuit region to an external wiring lead-out terminal can be reduced, a conductor layer corresponding to the W layer 50b described above can be more readily formed. In addition, in a microprocessor circuit, the present embodiment may only be applied to a logic circuit region.

OTHER EMBODIMENTS

While one SGT has been formed on one semiconductor pillar in the embodiments according to the present invention, the present invention can also be applied to circuit formation in which two or more SGTs are formed. The present invention can be applied to a connection between impurity layers in top parts of SGTs in uppermost parts of two semiconductor pillars on which two or more SGTs have been formed.

While the Si pillars 6a to 6f are formed in the first embodiment, the Si pillars may be replaced with semiconductor pillars made of other semiconductor materials. This similarly applies to other embodiments according to the present invention.

In addition, the N⁺ layers 32a, 32c, 32d, and 32f and the P⁺ layers 32b and 32e according to the first embodiment may be formed of Si or another semiconductor material layer containing donor or acceptor impurities. In addition, the N⁺ layers 32a, 32c, 32d, and 32f and the P⁺ layers 32b and 32e may be formed of different semiconductor material layers. This similarly applies to other embodiments according to the present invention.

In addition, in the first embodiment, the N⁺ layers 32a, 32c, 32d, and 32f and the P⁺ layers 32b and 32e are formed using a selective epitaxial crystal growth method. The N⁺ layers 32a, 32c, 32d, and 32f and the P⁺ layers 32b and 32e may be selectively formed by other methods including a method of repetitively performing CDE (Chemical Dry Etching) and ordinary epitaxial crystal growth to form the N⁺ layers 32a, 32c, 32d, and 32f and the P⁺ layers 32b and 32e on the top parts of the Si pillars 6a to 6f inside the depressions 30A to 30F. This similarly applies to other embodiments according to the present invention.

In addition, as the SiN layer 27 in outer circumferential parts of the Si pillars 6a to 6f, the SiO₂ layers 28a to 28f formed on exposed top parts of the Si pillars 6a to 6f and side surfaces of the mask material layers 7a to 7f, and the AlO layer 29 which surrounds the SiO₂ layers 28a to 28f, described in the first embodiment, another material layer made of a single layer or made up of a plurality of layers and containing an organic material or an inorganic material may be used as long as the materials serve the purpose of the present invention. This similarly applies to other embodiments according to the present invention.

In addition, in the first embodiment, the mask material layer 7 is formed of a SiO₂ layer, an aluminum oxide (Al₂O₃, also referred to as AlO) layer, and a SiO₂ layer. As the mask material layer 7, another material layer made of a single layer or made up of a plurality of layers and containing an organic material or an inorganic material may be used as long as the materials serve the purpose of the present invention. This similarly applies to other embodiments according to the present invention.

In addition, in the first embodiment, the band-shaped SiN layers 13aa, 13ab, 13ba, and 13bb entirely formed by an ALD method are formed on both sides of the band-shaped SiGe layers 8a and 8b as shown in FIGS. 1CA to 1CC and FIGS. 1DA to 1DC. As the band-shaped SiN layers 13aa, 13ab, 13ba, and 13bb and the band-shaped SiGe layers 8a and 8b, another material layer made of a single layer or made up of a plurality of layers and containing an organic material or an inorganic material may be used as long as the materials serve the purpose of the present invention. This similarly applies to other embodiments according to the present invention.

In addition, as described with reference to FIGS. 1AA to 1GC, the band-shaped mask material layers 17a and 17b which extend in the X direction and which are perpendicular to the band-shaped mask material layers 12aa, 12ab, 12ba, and 12bb and the band-shaped SiN layers 13aa, 13ab, 13ba, and 13bb which extend in the Y direction are formed by a method similar to the method of forming the band-shaped SiN layers 13aa, 13ab, 13ba, and 13bb. Accordingly, the Si pillars 6a to 6f are formed with high accuracy and high density in both the X direction and the Y direction. In addition, in the description of the present embodiment, the band-shaped mask material layers 17a and 17b are formed after forming the band-shaped mask material layers 12aa, 12*ab*, 12*ba*, and 12*bb* and the band-shaped SiN layers 13*aa*, 13*ab*, 13*ba*, and 13*bb*. In contrast, even by a step of forming the band-shaped mask material layers 12*aa*, 12*ab*, 12*ba*, and 12*bb* and the band-shaped SiN layers 13*aa*, 13*ab*, 13*ba*, and 13*bb* after forming the band-shaped mask material layers 17*a* and 17*b*, the Si pillars 6*a* to 6*f* can be formed in a same manner with high accuracy and high density. In addition, when there is leeway in the Y direction in terms of design, the band-shaped mask material layers 17*a* and 17*b* may be directly formed by a lithographic method and an RIE etching method instead of using the present method. In addition, when there is leeway in the X direction, the band-shaped mask material layers 12*aa*, 12*ab*, 12*ba*, and 12*bb* may be directly formed by a lithographic method and an RIE etching method instead of using the present method. In addition, as long as SRAM cell performance can be satisfied, the band-shaped mask material layers 12*aa*, 12*ab*, 12*ba*, and 12*bb* and the band-shaped mask material layers 17*a* and 17*b* which extend in the X direction may be formed using SADP (Self-Aligned Double Patterning, refer to A. Raley, S. Thibaut, N. Mohanty, K. Subhadeep, S. Nakamura, et al.: "Self-aligned quadruple patterning integration using spacer on spacer pitch splitting at the resist level for sub-32 nm pitch applications" Proc. Of SPIE Vol. 9782, 2016) and SAQP (Self-Aligned Quadruple Patterning, refer to A. Raley, S. Thibaut, N. Mohanty, K. Subhadeep, S. Nakamura, et al.: "Self-aligned quadruple patterning integration using spacer on spacer pitch splitting at the resist level for sub-32 nm pitch applications" Proc. Of SPIE Vol. 9782, 2016). This similarly applies to other embodiments according to the present invention.

In addition, as described with reference to FIGS. 1HA to 1HC and FIGS. 1IA to 1IC in the first embodiment, after forming the SiN pillars 20*a*, 20*b*, 20*c*, 20*d*, 20*e*, 20*f*, 20*g*, and 20*h* which have rectangular mask material layers 19*a*, 19*b*, 19*c*, 19*d*, 19*e*, 19*f*, 19*g*, and 19*h* in top parts thereof, the rectangular mask material layers 19*b* and 19*g* and the SiN pillars 20*b* and 20*g* are removed. Accordingly, formation regions for the contact holes C1 and C2 without Si pillars are formed in the regions where the contact holes C1 and C2 are present as shown in FIG. 1 in a plan view. In contrast, the formation regions for the contact holes C1 and C2 may be formed by forming Si pillars in the formation regions for the contact holes C1 and C2 and subsequently removing the Si pillars. In addition, the formation regions for the contact holes C1 and C2 may be formed by a method of not forming Si pillars in regions where the contact holes C1 and C2 are present by forming the band-shaped mask material layers 17*a* and 17*b* and subsequently performing a step of removing the band-shaped mask material layers 17*a* and 17*b* in the formation regions for the contact holes C1 and C2. As described above, the formation regions for the contact holes C1 and C2 may be formed by a method other than the method described in the first embodiment. This similarly applies to other embodiments according to the present invention.

In addition, in the first embodiment, as shown in FIGS. 1TA to 1TC, the N$^+$ layers 3*aa*, 3*ab*, 3*ba*, and 3*bb* and the P$^+$ layers 4*aa* and 4*bb* to be a source or a drain of an SGT are formed connected on the N layers 2*a* and 2*b* in a lower part of the Si pillars 6*a* to 6*f*. In contrast, the N$^+$ layers 3*aa*, 3*ab*, 3*ba*, and 3*bb* and the P$^+$ layers 4*aa* and 4*bb* may be formed in bottom parts of the Si pillars 6*a* to 6*f* and the N$^+$ layers 3*aa*, 3*ab*, 3*ba*, and 3*bb* and the P$^+$ layers 4*aa* and 4*bb* may be connected to each other via a metal layer or an alloy layer. In addition, the N$^+$ layers 3*aa*, 3*ab*, 3*ba*, and 3*bb* and the P$^+$ layers 4*aa* and 4*bb* may be formed connected to side surfaces of the bottom parts of the Si pillars 6*a* to 6*f*. As described above, the N$^+$ layers 3*aa*, 3*ab*, 3*ba*, and 3*bb* and the P$^+$ layers 4*aa* and 4*bb* to be a source or a drain of an SGT may be formed inside the bottom parts of the Si pillars 6*a* to 6*f*, in contact with an outer side of side surfaces of the Si pillars 6*a* to 6*f*, or in an outer circumference of the Si pillars 6*a* to 6*f*, and the respective layers may be electrically connected by other conductive materials. This similarly applies to other embodiments according to the present invention.

In addition, while the band-shaped mask material layers 9*a*, 9*b*, 12*aa*, 12*ab*, 12*ba*, and 12*bb* are formed so that positions of respective upper surfaces and bottom parts thereof in the vertical direction are the same, the positions of respective upper surfaces and bottom parts may differ in the vertical direction as long as the purpose of the present invention is served. This similarly applies to other embodiments according to the present invention. This similarly applies to other embodiments according to the present invention.

In addition, in the first embodiment, thicknesses and shapes of the band-shaped mask material layers 9*a*, 9*b*, 12*aa*, 12*ab*, 12*ba*, and 12*bb* change due to polishing by CMP, RIE etching, and cleaning. The change is not an issue as long as the purpose of the present invention is served. This similarly applies to other embodiments according to the present invention.

In addition, a material of the various wiring metal layers 34*a*, 34*b*, WL, Vdd, Vss, BL, and RBL according to the first embodiment is not limited to a metal and may be a conductive material layer such as a semiconductor layer containing a large amount of an alloy, acceptor impurities, or donor impurities and may be constructed by a single layer or a plurality of layers of the conductive material layer. This similarly applies to other embodiments according to the present invention.

In addition, in the first embodiment, the TiN layers 24*a*, 24*b*, 24*c*, and 24*d* are used as gate metal layers as shown in FIGS. 1JA to 1JC. As the TiN layers 24*a*, 24*b*, 24*c*, and 24*d*, a material layer made of a single layer or made up of a plurality of layers may be used as long as the materials serve the purpose of the present invention. The TiN layers 24*a*, 24*b*, 24*c*, and 24*d* can be formed of a conductor layer such as a single metal layer or a plurality of metal layers with at least a desired work function. Another conductive layer such as a W layer may be formed on an outer side of the conductive layer. In this case, the W layer acts as a metal wiring layer which connects the gate metal layers. A single metal layer or a plurality of metal layers may be used besides a W layer. In addition, while the HfO$_2$ layer 23 is used as the gate insulating layers, another material layer made of a single layer or made up of a plurality of layers may be used as each gate insulating layer. This similarly applies to other embodiments according to the present invention.

In the first embodiment, the Si pillars 6*a* to 6*f* have a circular shape in a plan view. The shape of a part of or all of the Si pillars 6*a* to 6*f* in a plan view may be a circle, an ellipse, a shape elongated in one direction, or the like. In addition, even in a logic circuit region which is formed separated from the SRAM cell region, a mixture of Si pillars with different shapes in a plan view can be formed in the logic circuit region in accordance with logic circuit design. These descriptions similarly apply to other embodiments according to the present invention.

In addition, in the first embodiment, the N$^+$ layers 3*aa*, 3*ab*, 3*ba*, and 3*bb* and the P$^+$ layers 4*aa* and 4*bb* are formed so as to be connected to bottom parts of the Si pillars 6*a* to 6*f*. An alloy layer made of a metal, silicide, or the like may be formed on upper surfaces of the N⁺ layers 3*aa*, 3*ab*, 3*ba*, and 3*bb* and the P⁺ layers 4*aa* and 4*bb*. In addition, a source or drain impurity region of an SGT may be formed by forming a P⁺ layer or an N⁺ layer containing donor or acceptor impurity atoms by, for example, an epitaxial crystal growth method on outer circumferences of the bottom parts of the Si pillars 6*a* to 6*f*. In this case, an N⁺ layer or a P⁺ layer may or may not be formed inside Si pillars in contact with the N⁺ layer or the P⁺ layer formed by the epitaxial crystal growth method. Alternatively, an extended metal layer or an extended alloy layer may be provided in contact with the P⁺ layer or the N⁺ layer. This similarly applies to other embodiments according to the present invention.

In addition, while SGTs are formed on the P layer substrate 1 in the first embodiment, a SOI (Silicon On Insulator) substrate may be used instead of the P layer substrate 1. Alternatively, a substrate made of other materials may be used as long as the role of a substrate is served. This similarly applies to other embodiments according to the present invention.

In addition, while SGTs that constitute a source and a drain using the N⁺ layers 3*aa*, 3*ab*, 3*ba*, and 3*bb*, the P⁺ layers 4*aa* and 4*bb*, the N⁺ layers 32*a*, 32*c*, 32*d*, and 32*f*, and the P⁺ layers 32*b* and 32*e* which have conductivity of the same polarity in upper and lower positions of the Si pillars 6*a* to 6*f* have been described in the first embodiment, the present invention can also be applied to tunnel SGTs having a source and a drain with different polarities. This similarly applies to other embodiments according to the present invention.

In addition, in the first embodiment, the N⁺ layers 32*a*, 32*c*, 32*d*, and 32*f* and the P⁺ layers 32*b* and 32*e* are formed after forming the gate HfO₂ layer 23 and the gate TiN layers 24*a*, 24*b*, 24*c*, and 24*d*. In contrast, the gate HfO₂ layer 23 and the gate TiN layers 24*a*, 24*b*, 24*c*, and 24*d* may be formed after forming the N⁺ layers 32*a*, 32*c*, 32*d*, and 32*f* and the P⁺ layers 32*b* and 32*e*. This similarly applies to other embodiments according to the present invention.

In addition, in the second embodiment, the thin single-crystal Si layer 45 is formed by an ALD method and the P⁺ layer 46 containing acceptor impurities is formed by an epitaxial crystal growth method. The thin single-crystal Si layer 45 is a material layer for obtaining the P⁺ layer 46 with good crystallinity. A single layer or a plurality of layers of other material layers may be used as long as the material layers enable the P⁺ layer 46 with good crystallinity to be obtained.

In addition, in a vertical NAND flash memory circuit, with a semiconductor pillar as a channel, a memory cell constituted of a tunnel oxide layer, a charge storage layer, an interlayer insulating layer, and a control conductor layer which surround the semiconductor pillar are formed in a plurality of stages in the vertical direction. Semiconductor pillars at both ends of the memory cells have a source line impurity layer which corresponds to a source and a bit line impurity layer which corresponds to a drain. In addition, with respect to one memory cell, if one of the memory cells on both sides serves as a source, the other memory call serves as a drain. In this manner, a vertical NAND flash memory circuit is a type of an SGT circuit. Therefore, the present invention can also be applied to a hybrid circuit equipped with a NAND flash memory circuit.

The present invention enables various embodiments and modifications to be devised without departing from the broad spirit and scope of the present invention. In addition, the embodiments described above are for explaining examples of the present invention and are not intended to limit the scope of the present invention. The embodiments and the modifications described above can be arbitrarily combined. Furthermore, even if parts of constituent features of the embodiments described above are removed as necessary, such removal of constituent features is within the technical ideas of the present invention.

A pillar-shaped semiconductor device and a manufacturing method thereof according to the present invention enable a high-density pillar-shaped semiconductor device to be obtained.

What is claimed is:

1. A manufacturing method of a pillar-shaped semiconductor device, comprising the steps of:
    forming a first impurity layer on a substrate;
    forming a first semiconductor layer on the first impurity layer;
    forming a second impurity layer on the first semiconductor layer;
    forming a first material layer on the second impurity layer;
    forming a first semiconductor pillar by using the first material layer as a mask to etch the second impurity layer, the first semiconductor layer, and an upper layer of the first impurity layer in this order from top to bottom;
    forming a gate insulating layer which surrounds the first semiconductor layer of the first semiconductor pillar and a gate conductor layer which surrounds the gate insulating layer;
    forming a first interlayer insulating layer above an upper surface of the gate conductor layer in an outer circumferential part of a top part of the first semiconductor pillar;
    forming a second material layer on the first interlayer insulating layer so as to surround side surfaces of the top part of the first semiconductor pillar and the first material layer;
    forming a second interlayer insulating layer in an outer circumferential part in contact with a side surface of the second material layer;
    forming a first depression which surrounds the top part of the first semiconductor pillar by using the second interlayer insulating layer as a mask to remove the first material layer and the second material layer;
    forming a third impurity layer so as to surround the second impurity layer in the top part of the first semiconductor pillar and inside the first depression;
    forming a first conductor layer made of a metal or an alloy on the third impurity layer;
    forming a third interlayer insulating layer on the first conductor layer;
    forming a first band-shaped contact hole which extends in a band shape on the third interlayer insulating layer on the first conductor layer; and
    forming a first wire conductor layer which connects to the first conductor layer via the first band-shaped contact hole, wherein
    the first conductor layer protrudes more toward a side of the first wire conductor layer than the first contact hole in a plan view.

2. The manufacturing method of a pillar-shaped semiconductor device according to claim 1, comprising the steps of:
    forming a fourth impurity layer adjacent to the first impurity layer on the substrate;
    forming the first semiconductor layer on the first impurity layer and the fourth impurity layer;

forming the second impurity layer and a fifth impurity layer on the first semiconductor layer;

forming a third material layer on the fifth impurity layer;

forming the first semiconductor pillar by using the first material layer as a mask to etch the first impurity layer, the first semiconductor layer, and the second impurity layer in this order from top to bottom and, at the same time, forming a second semiconductor pillar by using the third material layer as a mask to etch the fifth impurity layer, the first semiconductor layer, and the fourth impurity layer in this order from top to bottom;

forming the gate insulating layer which surrounds the first semiconductor layer of the first semiconductor pillar and the second semiconductor pillar and the gate conductor layer which surrounds the gate insulating layer;

forming the first interlayer insulating layer above the upper surface of the gate conductor layer in the outer circumferential part of the top part of the first semiconductor pillar;

forming the second material layer on the first interlayer insulating layer so as to surround side surfaces of the top part of the first semiconductor pillar and the first material layer and, at the same time, forming a fourth material layer on the first interlayer insulating layer so as to surround side surfaces of a top part of the second semiconductor pillar and the third material layer;

forming the second interlayer insulating layer in an outer circumferential part in contact with side surfaces of the second material layer and the fourth material layer;

forming the first depression which surrounds the top part of the first semiconductor pillar and a second depression which surrounds the top part of the second semiconductor pillar by using the second interlayer insulating layer as a mask to remove the first material layer, the second material layer, the third material layer, and the fourth material layer;

forming the third impurity layer inside the second depression and, at the same time, forming a sixth impurity layer so as to surround the fifth impurity layer in the top part of the second semiconductor pillar;

forming a second conductor layer made of a metal or an alloy on the sixth impurity layer;

forming the first band-shaped contact hole on the third interlayer insulating layer on the second conductor layer; and forming the first wire conductor layer which connects the first conductor layer and the second conductor layer via the first band-shaped contact hole, wherein the semiconductor pillar which differs from the first semiconductor pillar and the second semiconductor pillar is not formed in a formation region of the first wire conductor layer in a plan view.

3. The manufacturing method of a pillar-shaped semiconductor device according to claim 2, comprising the steps of:

forming a third interlayer insulating layer on the first conductor layer, the second conductor layer, and the second interlayer insulating layer;

forming the first band-shaped contact hole which overlaps with a partial region of the first conductor layer and a partial region of the second conductor layer in a plan view on the third interlayer insulating layer; and forming the third wire conductor layer by filling the first band-shaped contact hole, wherein partial regions of the first conductor layer and the second conductor layer protrude more outward than the first band-shaped contact hole in a plan view.

4. The manufacturing method of a pillar-shaped semiconductor device according to claim 2, comprising the steps of:

forming a first mask material layer which overlaps with partial regions of the first material layer and the third material layer and partial regions of the second material layer and the fourth material layer and which connects the partial regions and forms a cavity in a plan view after forming the second interlayer insulating layer;

forming a third depression by using the first mask material layer as a mask to etch the first material layer, the third material layer, the second material layer, the fourth material layer, and the second interlayer insulating layer;

forming the third impurity layer and the sixth impurity layer so as to be connected to each other in the third depression; and forming a third conductor layer on the third impurity layer and the sixth impurity layer being connected to each other and in the third depression.

5. The manufacturing method of a pillar-shaped semiconductor device according to claim 4, wherein the third conductor layer is the first wire conductor layer.

6. The manufacturing method of a pillar-shaped semiconductor device according to claim 1, wherein the third impurity layer is formed by epitaxial crystal growth.

7. The manufacturing method of a pillar-shaped semiconductor device according to claim 1, comprising the steps of:

forming the third impurity layer inside the first depression;

forming the first conductor layer made of a metal or an alloy on the third impurity layer so that an upper surface of the first conductor layer becomes higher than an upper surface of the second interlayer insulating layer; and planarizing the first conductor layer so that an upper surface position of the first conductor layer equals an upper surface position of the second interlayer insulating layer.

8. The manufacturing method of a pillar-shaped semiconductor device according to claim 4, comprising the steps of:

forming a single crystal semiconductor thin film layer on a bottom part surface of the third depression; and consecutively forming a seventh impurity layer.

9. The manufacturing method of a pillar-shaped semiconductor device according to claim 2, wherein a load SGT (Surrounding Gate Transistor) for an SRAM (Static Random Access Memory) cell circuit is formed on the first semiconductor pillar and the second semiconductor pillar.

* * * * *